(12) United States Patent
Prichard

(10) Patent No.: US 8,150,325 B1
(45) Date of Patent: Apr. 3, 2012

(54) BLANKING SYSTEM

(75) Inventor: Brad A. Prichard, Bloomington, IN (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 965 days.

(21) Appl. No.: 12/137,834

(22) Filed: Jun. 12, 2008

(51) Int. Cl.
  *H04B 1/00* (2006.01)
  *H04B 15/00* (2006.01)

(52) U.S. Cl. .................. 455/63.1; 455/67.11; 455/67.13; 455/67.16; 455/204; 455/223; 455/69; 348/478; 348/606; 348/634; 348/635; 375/429; 375/340; 370/205; 370/212; 370/321; 342/27; 342/176; 702/57; 702/65; 324/691; 324/713

(58) Field of Classification Search .................. 455/63.1, 455/69, 67.11, 67.13, 67.16, 204, 223
See application file for complete search history.

(56) References Cited

U.S. PATENT DOCUMENTS

| | | | |
|---|---|---|---|
| 4,517,567 A | | 5/1985 | Lee et al. |
| 5,757,338 A | * | 5/1998 | Bassetti et al. .................. 345/3.2 |
| 6,212,238 B1 | * | 4/2001 | Chambers ...................... 375/259 |
| 6,700,530 B1 | * | 3/2004 | Nilsson .......................... 342/124 |
| 7,375,676 B1 | * | 5/2008 | Loberger ....................... 342/160 |
| 7,586,433 B1 | * | 9/2009 | Johansson et al. .............. 342/22 |
| 7,912,138 B2 | * | 3/2011 | Geile et al. ..................... 375/260 |
| 7,957,265 B2 | * | 6/2011 | Geile et al. ..................... 370/210 |
| 7,995,454 B2 | * | 8/2011 | Geile et al. ..................... 370/206 |

* cited by examiner

*Primary Examiner* — Marceau Milord
(74) *Attorney, Agent, or Firm* — Christopher A. Monsey

(57) ABSTRACT

An exemplary signal interference control system is disclosed that utilizes a computer system, such as programmable logic circuits or computer controlled logic gates, to generate blanking or control signals for various types of radio frequency receiver and transmitter combinations. Control signals are generated based on signal characteristic information stored in a memory including a delay following receipt of a pre-trigger signal from a radio frequency transmitter and a pulse width of control signal(s) generated for specified receivers, frequencies or systems. In one embodiment, information can be retrieved from a memory and used to generate an interference control signal. One or more control signals can be routed to a related or associated receiver to reduce or eliminate interference effects. Data representing associated radio frequency transmitters and receivers can be determined, synchronized and stored in data structures during testing operations until the received interference signals are properly aligned, synchronized or controlled at an associated receiver. Modified control signal data such as delay and interference control signal width information can be stored in a memory and used for future control signal generation.

49 Claims, 9 Drawing Sheets

| |
|---|
| Blanking Channel "1" (this number, e.g., "1", is also used as a port ID for output of Input MM 14 and input to Output MM 16) |
| Input Name (Transmitter 88 Name) |
| Input Number (inputs and outputs for CTU 11 and inputs to Input MM 14) |
| Output Number (output port for Output MM 16 and input and output ports for Output Driver 17) |
| Output Name (Receiver 90 Name) |
| Alignment Signal Instance (Assigned Port in Feedback Selection System (FSS) 21 coupled to Receiver 90 associated with Output Name Receiver e.g., "FSS port 1") [MULTIPLE INSTANCES - array within an array for each Receiver associated with the Transmitter 88 stored in above Input Name 88] [Required due to receiver characteristics having multiple signals required for aligning blanking pulse e.g., circuit pathways from various components in Receiver 90 to the blanking system 10] |
| Delay (A delay value associated with above referenced Transmitter / Receiver pair) |
| Pulse Width (A pulse width value associated with above referenced Transmitter / Receiver pair) |

| |
|---|
| Blanking Channel "N" (this number, e.g., "N", is also used as a port ID for output of Input MM 14 and input to Output MM 16) |
| Input Name (Transmitter 88 Name) |
| Input Number (inputs and outputs for CTU 11 and inputs to Input MM 14) |
| Output Number (output port for Output MM 16 and input and output ports for Output Driver 17) |
| Output Name (Receiver 90 Name) |
| Alignment Signal Instance (Assigned Port in Feedback Selection System (FSS) 21 coupled to Receiver 90 associated with Output Name Receiver e.g., "FSS port 1") [MULTIPLE INSTANCES - array within an array for each Receiver associated with the Transmitter 88 stored in above Input Name 88] [Required due to receiver characteristics having multiple signals required for aligning blanking pulse e.g., circuit pathways from various components in Receiver 90 to the blanking system 10] |
| Delay (A delay value associated with above referenced Transmitter / Receiver pair) |
| Pulse Width (A pulse width value associated with above referenced Transmitter / Receiver pair) |

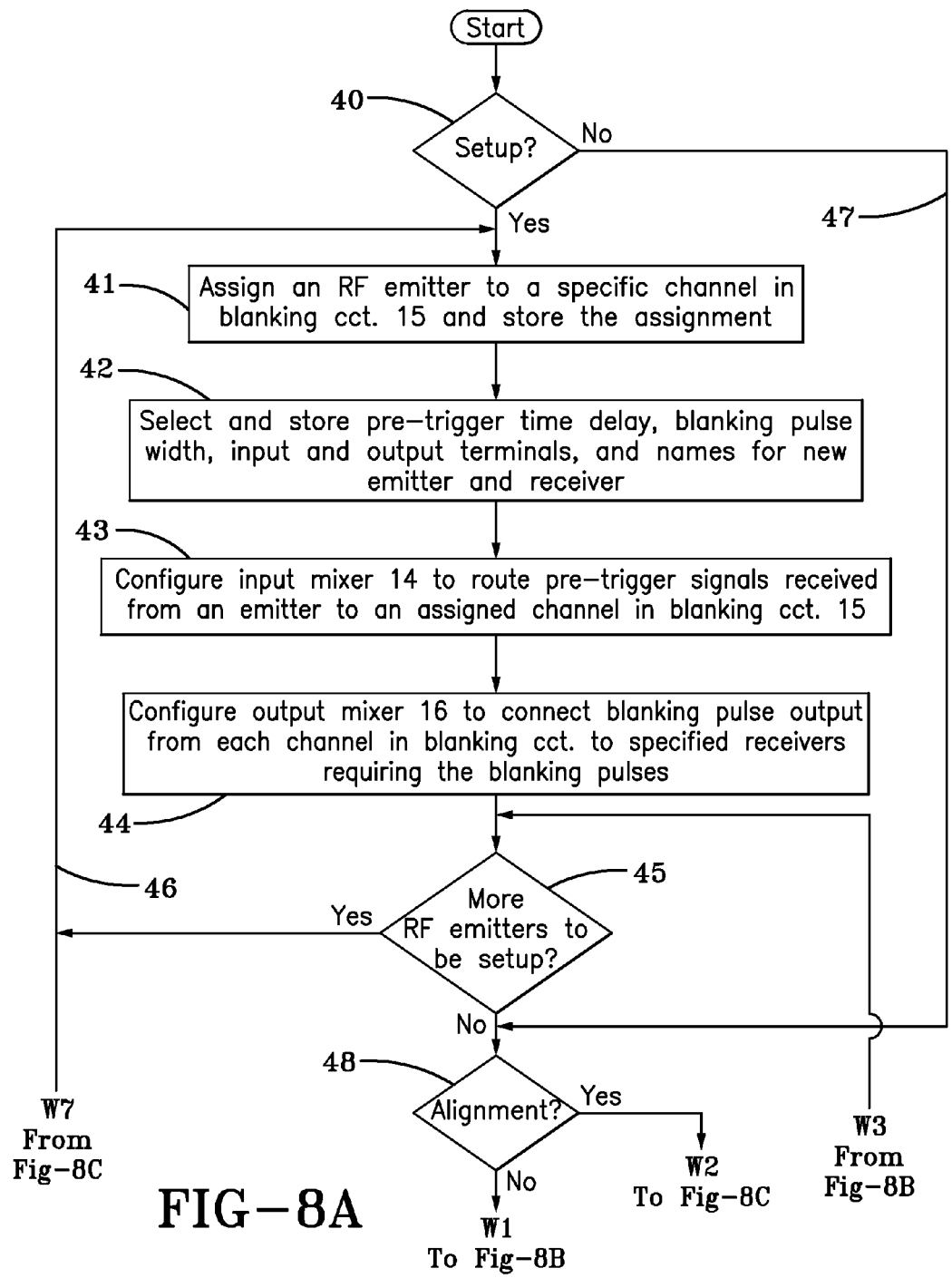

BLANKING SYSTEM

STATEMENT OF GOVERNMENT INTEREST

The invention described herein may be manufactured and used by or for the Government of the United States of America for governmental purposes without the payment of any royalty thereon or therefor.

FIELD OF THE INVENTION

The invention relates to a system for controlling interference with communications, navigational and radio receivers that operate in relative proximity to one or more transmitting equipment.

BACKGROUND

Electromagnetic interference (EMI) can be caused by electromagnetic spectrum (EMS) transmitter(s) generating EMS signals which cause degradation or other interference effects in a particular EMS receiver such as radio frequency (RF) transmitters, quantum computing systems using energy state modifying EMS pulses, fiber optic systems, infrared systems or any system which modulates and transmits an EMS signal. Reflections or other causes can also create EMI effects in an EMS receiver as well. EMI can increase with the number of receivers and transmitters within reception range of each other and multiple use of the same frequency. EMI effects can be increased due to decreasing proximity between EMS transmitter/receiver combinations using the same frequency.

A variety of approaches have been attempted to mitigate the effects of EMI on a particular EMS receiver with limited success. For example, blanking can include a process of momentarily switching off a receiver or a transmitter/receiver system during transmission. A receiver is not capable of receiving at least a portion of a radiated signal during the brief time interval that a receiver is blanked. Accordingly, existing blanking systems defeat the very purpose they are being used for, EMI mitigation, when they are blanking reception of non-EMI signals the EMS receiver that they are attached to is designed to receive.

Design of blanking systems is not an elemental exercise as it is dependant in a wide variety of variables. For example, these variables can include: number of transmitter/receiver combinations (a particular problem as the number of systems in reception proximity increases); cable length to and between various components in a blanking system; capacity of computer processors and signal buffers to simultaneously process signals for large numbers of inputs, EMS transmitter and EMS receiver combinations; distance from each EMS transmitter to its antenna; sources of reflection; size and power limitations on test systems or end items which a blanking system in incorporated therein; and distance from an EMS transmitter antenna to one or more EMS receiver antennas. In addition, blanking pulses can also be affected by receiver sensitivity. Many of these factors are unique for each EMS transmitter and EMS receiver combination.

Existing blanking systems are not able to adequately address the above variables and current EMS environment. Thus, improvements to blanking systems are needed.

SUMMARY OF THE INVENTION

An exemplary signal interference control system is disclosed that utilizes a computer system, such as programmable logic circuits or computer controlled logic gates, to generate blanking or control signals for various types of EMS receiver and transmitter combinations. Control signals are generated based on signal characteristic information stored in a memory including a delay following receipt of a pre-trigger signal from an EMS transmitter and a pulse width of control signal(s) generated for specified receivers, frequencies or systems. In one embodiment, information can be retrieved from a memory and used to generate an interference control signal. One or more control signals can be routed to a related or associated receiver to reduce or eliminate interference effects. Data representing associated radio frequency transmitters and receivers can be determined, synchronized and stored in data structures during testing operations until the received interference signals are properly aligned, synchronized or controlled at an associated receiver. Modified control signal data such as delay and interference control signal width information can be stored in a memory and used for future control signal generation.

BRIEF DESCRIPTION OF THE DRAWINGS

The invention will be better understood upon reading the following Detailed Description of the preferred embodiment of the invention in conjunction with the drawing in which:

FIG. 6 shows exemplary data structures for one or more EMS transmitters storing information used by an embodiment of the invention to generate control or blanking pulse signals;

FIGS. 8A through 8C show an exemplary flowchart for EMI control or blanking circuit operations.

DETAILED DESCRIPTION

Figure 1:
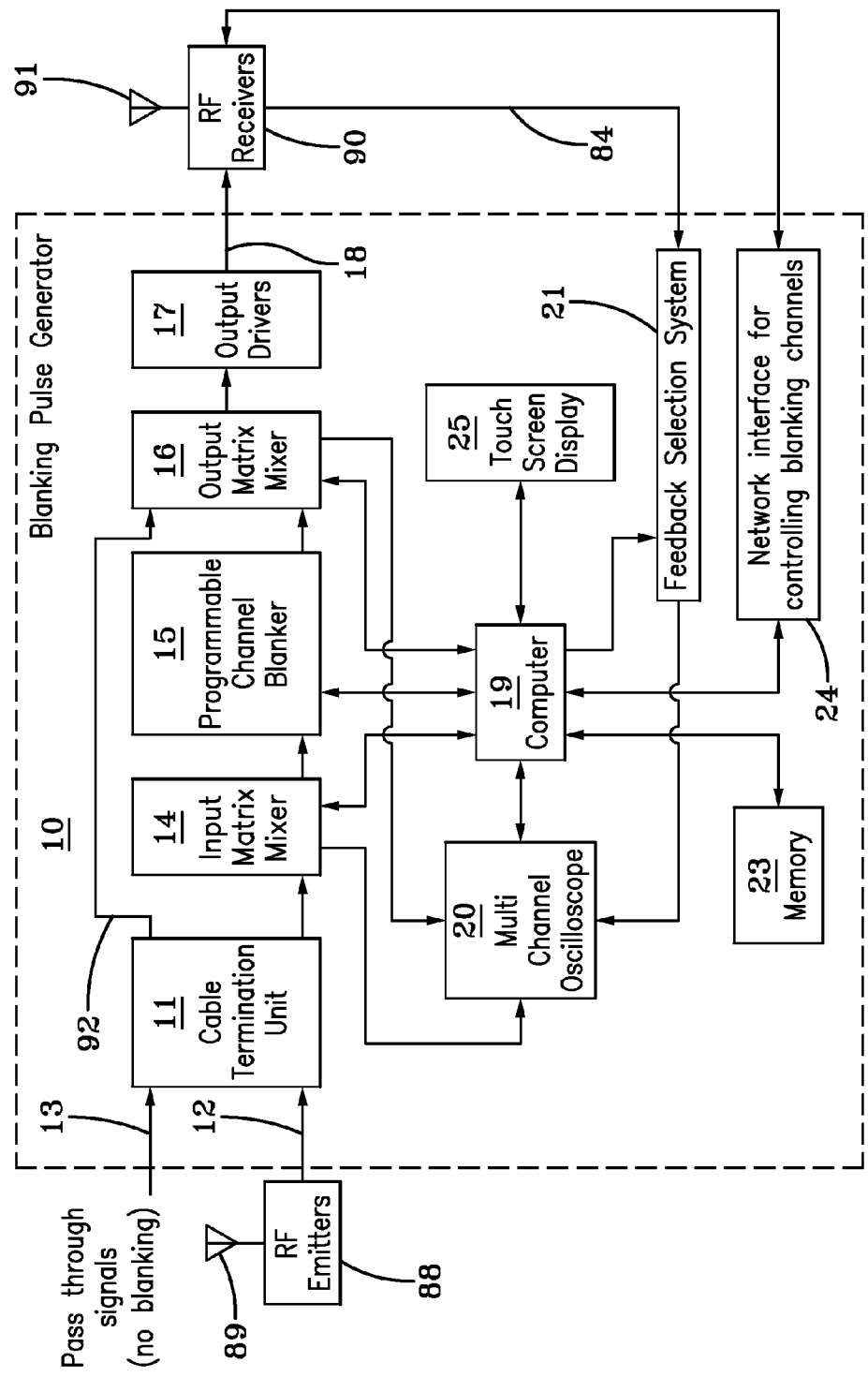
FIG. 1 shows an exemplary system block diagram of a Blanking Pulse Generator (BPG) in accordance with the invention.

Referring to FIG. 1, therein is shown a block diagram of a novel interference control or BPG 10 in accordance with an exemplary embodiment of the invention. One or more EMS Transmitters 88 are coupled to BPG 10 using cables 12 which are coupled to a Cable Termination Unit (CTU) 11. Examples of EMS Transmitters 88 connected to CTU 11 are navigation, air traffic control radar and weather radar systems. An antenna 89 is coupled to each EMS Transmitter 88 in this example.

CTU 11 also receives one or more (e.g., five) pass through signals on cables 13 that are routed around Input Matrix Mixer (hereinafter "Input MM") 14 and PCB 15 via path 92 to Output Matrix Mixer (hereinafter "Output MM") 16 for direct routing to a selected or predetermined EMS Receiver (s) 90. These pass through signals are typically interference control signals or blanking pulses generated for one EMS Transmitter 88 and passed on to another EMS Transmitter 88 (not shown) and/or EMS Receiver 90. In some embodiments, there are certain combinations of EMS transmitter/receivers which include signal processing control systems for interacting with each other. In the case of these particular EMS transmitter/receiver combinations, pass through signals may be used to perform secondary blanking pulse signal processing directly at the receiver based on the pass through signal, sometimes for filtering at the EMS receiver, sometimes for sensitivity control at the EMS receiver and sometimes for tuning control at the EMS receiver if it is, for example, a super heterodyne receiver which will skip over a frequency when a pass through signal is active. Secondary blanking pulse signal processing or other processing associated with use of the above referenced pass through signals can be done with or without use of a blanking pulse signal generated by an embodiment of this invention such as described herein.

CTU 11 can be a pass through bus which properly terminates all cables from EMS transmitters and modifies received pre-trigger signals into a common pre-trigger signal format for subsequent processing. CTU 11 can include a bus that has different termination values that can selectively be physically or electronically connected to different output ports. These output ports in this embodiment are coupled to a bus which in turn is coupled to an Input MM 11 as well as Output MM 16. CTU 11 can include a switching unit function which permits user selection of various inputs and outputs. CTU 11 can be designed to permit multiple connector interfaces such as RS422, RS485 and RS232 in addition to other types of cable connectors such as coaxial cable inputs in order to receive additional types of pre-trigger inputs or signals which have various signal characteristics including cable impedance. For example, one BPG 10 embodiment can include 125 ohm inputs. The CTU 11 inputs can be supplemented by 50 ohm inputs and other inputs to accommodate serial communication standards to accommodate future transmitters sending pre-trigger signals to the BPG 10. An example of pre-trigger signal format processing is where a CTU 11 receives a 50 volt pre-trigger pulse from an EMS transmitter on a 125 ohm coaxial cable and converts that pulse into a TTL compatible signal (e.g., a binary sequence). Examples of pre-trigger signals from an EMS transmitter could include any signal which is used to indicate an EMS system is preparing to transmit or another system which is able to determine an EMS system is preparing to transmit.

Exemplary Input MM 14 receives pre-trigger signals from CTU 11 over an input bus which couples the CTU 11 and the Input MM 14. Input MM 14 also sends selected pre-trigger signals to Multi-Channel Oscilloscope (MCO) 20 based on control inputs from Computer 19 (further described below). Input MM 14 also is coupled to Computer 19 which controls operations of Input MM 14 based on programs and stored data (further described below).

This example, Input MM 14 includes multiple Field Programmable Gate Arrays (FPGA) that are programmed by Computer 19 to route each EMS transmitter pre-trigger signal received from the bus coupled to CTU 11 to one or more programmable blanking channels (further described below) within the exemplary PCB 15. PCB 15 has an input circuit structure coupled on one hand to Input MM 14 and on the other hand to individual programmable blanking channels. In this sense, the Input MM 14 acts as a switching unit for routing pre-trigger signals to a particular bus line going into to a PCB 15. Computer 19 is programmed to determine or control how Input MM 14 routes pre-trigger signals to PCB 15 and MCO 20 based on user inputs, data associating EMS transmitter/receiver combinations stored in Computer 19 and EMI versus blanking pulse signal comparisons accomplished by MCO 20.

FPGAs in this embodiment are programmed in the field after manufacture. They contain programmable logic components called "logic processing sequences" and programmable interconnects. Logic processing sequences can be programmed to perform the function of basic logic gates such as, but not limited to, AND and XOR. This provides the ability for logic processing sequences to function as a router as in exemplary Input MM 14. Being as they can be programmed in the field they are useful in the present exemplary embodiment of the invention where new types of EMS Transmitters 88 may be interconnected with an exemplary BPG 10.

PCB 15 receives pre-trigger inputs from Input MM 14. PCB 15 includes programmable blanking channels which tunes/generates blanking pulses/signals and sends them to Output MM 16 based on control inputs from Computer 19 (further described below). It should be understood that the term programmable blanking channel in this description refers to a function or circuit, e.g., a circuit having function(s) described in reference to FIGS. 4 and 5 and receiving inputs from systems described in FIGS. 1 and 3 including Input MM 14 and Computer 19 such that the programmable blanking channel controls, creates and tunes blanking pulse signals in accordance with the invention. In other words, the term programmable blanking channel should not be understood to merely be a bus or wire structure used for conveying a signal.

Functionality for each programmable blanking channel is implemented using one or more FPGAs in this embodiment. It is also possible to have functionality for multiple (e.g., four) programmable blanking channels for each FPGA as an FPGA can be programmed to perform more than one logic/signal processing function at the same time. In other words, multiple inputs received from Input MM 14 can be coupled to a single FPGA performing multiple functions associated with a programmable blanker channel operation. Alternatively, multiple logic structures can be implemented in hardware such as in an application specific integrated circuit (ASIC) or as software using one or more processors. Another implementation could be using programmable integrated circuits (PIC) for each programmable blanking channel.

Figure 2:
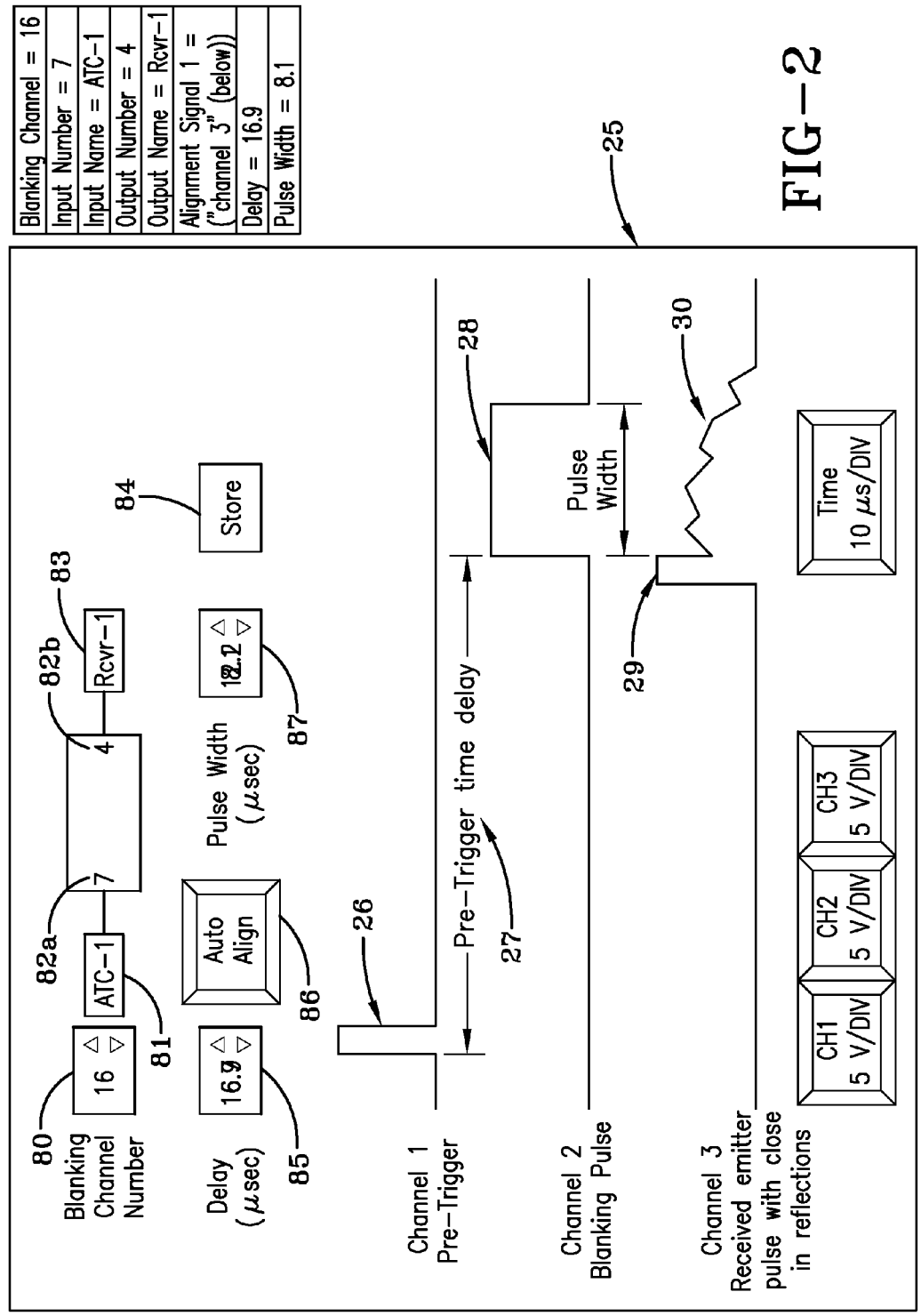
FIG. 2 shows an exemplary display having touch screen icons and signal traces used for configuration and aligning blanking pulse generation where an ineffective blanking pulse is shown which is not adjusted/tuned to signal characteristics of an EMI signal.
Figure 3:
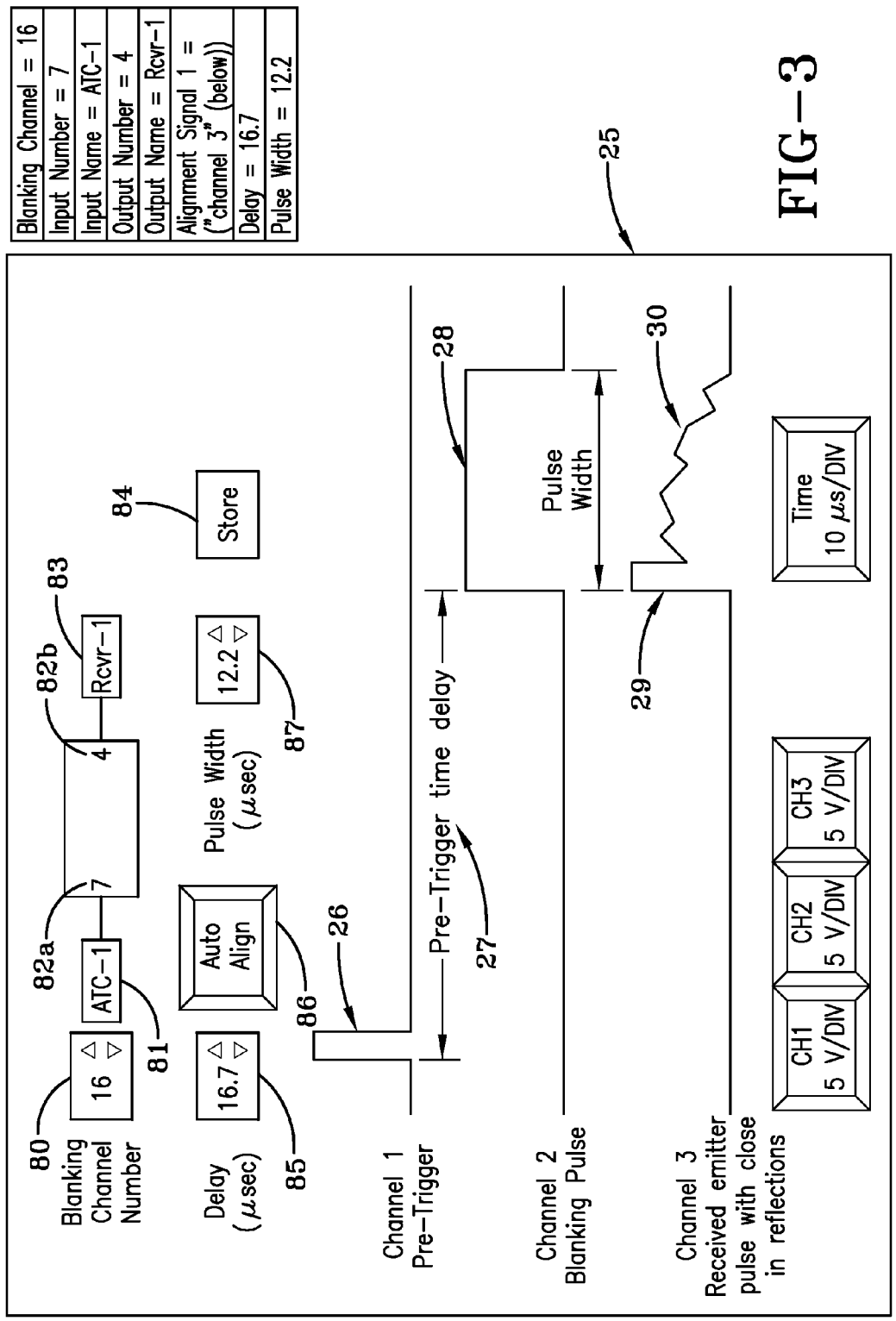
FIG. 3 shows a different exemplary display having touch screen icons and signal traces used for configuration and aligning blanking pulse generation where an effective blanking pulse is shown which is adjusted/tuned to signal characteristics of an EMI signal.

Timing circuits (not shown) are implemented as part of the programmable blanking channels implemented in PCB 15 to measure timing of EMI signals in comparison to blanking pulse signals created by programmable blanking channels. An example of their use is shown in and described with reference to FIGS. 2 and 3. In FIG. 2, initially an estimated delay and pulse width for a blanking pulse signal are assumed and stored. In FIG. 3 a required delay and pulse width for a blanking pulse signal can be determined during alignment and stored in a data structure shown in FIG. 6 for subsequent use in generating blanking pulse signals.

BPG 10 also includes an Output MM 16 which performs a routing function and a signal processing function such as a logical OR function. Output MM 16 receives inputs from Computer 19, CTU 11 (e.g., pass through signals) and PCB 15 (e.g., blanking pulses). Output MM 16 outputs data to Computer 19 and Output Driver 17. In this embodiment, Computer 19 controls Output MM 16 operations with the exception of the logical OR function which is automatic.

Output Drivers 17 converts blanking pulse signals into a format required by EMS Receivers 90. For example, blanking pulse signals in TTL signal format are converted to 125 ohm, 25 v signals that are input into an EMS Receiver 90.

MCO 20 receives selected pre-trigger signals from Input MM 14, selected blanking pulse signals from Output MM 16, selected feedback signals from EMS Receivers 90 based on a Feedback Selection System (FSS) 21 coupled to and controlled by Computer 19. In this embodiment, the FSS 21 includes a multiplexer as it receives multiple inputs from EMS Receivers 90 and outputs a signal(s) to MCO 20.

An embodiment of the BPG 10 can utilize an open architecture system such as Virtual Machine Environment (VME) or VME extensions for Instrumentation (VXI). This allows the use of commercially available equipment for common functions like the MCO 20, the Input MM 14 and Output MM 16, the PCB 15 and the computer hardware Computer 19, Memory Unit 23, Touch Screen Display 25 and timing circuits (included in PCB 15) shown in FIG. 1.

BPG 10 also includes a Touch Screen Display 25 to permit a user to program or control Computer 19. Computer 19 is coupled to Touch Screen Display 25 as a human machine interface. Other embodiments may include any variation in the human machine interface to permit a user to perform control and input functions associated with the embodiments described herein or the invention. Touch Screen Display 25 functions are further discussed below.

An exemplary MCO card 20 can be rack mounted with Computer 19 and Touch Screen Display 25. One MCO 20 that can be used is model NI PZI-5105 from National Instruments. Under the control of Computer 19, a MCO 20 (e.g., a card) receives selected pre-trigger signal inputs from Input MM 14 and selected received signals from EMS Receiver(s) 90 via FSS 21.

MCO 20 in this embodiment does not include a video display; accordingly display signals generates by the MCO 20 are sent to Computer 19 which in turn sends the display signals to Touch Screen Display 25. Exemplary signals from MCO 20 displayed on exemplary Touch Screen Display 25 are shown in FIGS. 2 and 3. Other visual displays may be implemented, such as a touch screen keyboard (not shown) for a user to enter information during system configuration and alignment.

Exemplary Computer 19 control functions include: control of blanking pulse signal adjustment/tuning performed in PCB 15; routing control functions performed in Input MM 14, Output MM 16, FSS 21; control of MCO 20 settings and output selections; and control of display functions of Touch Screen Display 25. Computer 19 communicates with EMS Receivers 90 via Network Interface 24. Computer 19 is coupled to a Memory Unit 23 which stores programs and data structures for executing blanking operations.

A program stored in Memory Unit 23 and running on Computer 19 can use programmable blanking channel assignment information in a data structure stored in Memory Unit 23 to generate control signals that are sent to appropriate FPGAs in exemplary Input MM 14 to program connections through Input MM 14 to specific programmable blanking channel assignment inputs within PCB 15. Connections or programmable blanking channel assignments in this embodiment can remain until a user changes the assignment table. Programmable blanking channel assignment information in these exemplary data structures are described with reference to FIG. 6 and the entries are stored therein during system configuration and at appropriate times thereafter.

A program stored in Memory Unit 23 and running on Computer 19 also creates and stores routing assignment information for FSS 21 (e.g., EMS Receiver 90 signals routed/selected and sent to MCO 20) and Output MM 16 (e.g., blanking pulse signals routed to EMS Receivers 90 through Output Drivers 17) using user inputs received from Touch Screen Display 25. Memory Unit 23 stores a data structure (e.g., see FIG. 6) which stores routing assignment data which indicates an identity for each device coupled to each bus or port such as CTU 11, Input MM 14, PCB 15, Output MM 16, FSS 21 and EMS Receivers 90. This identity data is accessed to display and facilitate touch screen icon choices shown in exemplary FIGS. 2 and 3. In other words, this routing assignment data is used as a routing table for use in associating different components with programmable blanking channels in PCB 15 and performing signal routing functions between system components including CTU 11, Input MM 14, PCB 15, Output MM 16, FSS 21 and EMS Receivers 90 where Computer 19 controls routing functions based on data in this routing table and user inputs using the Touch Screen Display 25. This routing information is entered manually in this embodiment during prior to a user using the Touch Screen Display 25 to associate various system components but it could be automatically sensed or created using manual and automatic processing or devices. In the example shown in FIG. 3, programmable blanking channel number "16" is shown as the programmable blanking channel touch screen icon choice 80. The numeral "16" indicates a specific input/output port in PCB 15.

It should be understood that alternative embodiments of Computer 19 can include hardware, software or combined hardware/software implementations of the functions described herein or otherwise performed by the invention. Additional details regarding functionality accomplished by Computer 19 are described below.

BPG 10 also includes a Network Interface 24 from BPG 10 to EMS Receivers 90. This Network Interface 24 permits interactive control by EMS Receiver(s) 90 to temporarily disable interference control or blanking pulse signal generation when there is no frequency conflict between EMS Transmitters 88 and specific EMS Receivers 90. Feedback is provided to the users regarding interference control or programmable blanking channels that are disabled. Operation of interactive control is shown on Touch Screen Display 25 or other human machine interfaces.

Referring to FIGS. 2 and 3, an exemplary graphical depiction of data received from MCO 20 and other portions of BPG 10 is shown. In particular, these graphical depictions have two major components—signal traces and touch screen data input (e.g., drop down menus) and data display icons. These exemplary signal traces are produced by MCO 20 and output into Computer 19 which are passed along and displayed on Touch Screen Display 25. Touch screen data input and data display icons are generated by Computer 19 and displayed on Touch Screen Display 25 and are used to perform various functions such as data entry, drop down menu item selection and control function selection. Examples of data entry, drop down menu item selection or control function selection via touch screen icons are Programmable Blanking Channel Number Selection touch screen icon 80, EMS transmitter drop down menu display/select 81 (e.g., ATC-1), Input MM 14 connector number 82*a* (e.g., routing connector number "7"), Output MM 16 connector number 82*b* (e.g., routing connector number "4"), EMS receiver drop down menu display/select 83 (e.g., receiver selection "Rcvr-1"). The exemplary drop down menus or display/select menus shown in FIGS. 2 and 3 permit selection of one of multiple device and connection/routing choices displayed in the selection menus. These displayed choices include various pre-input data such as for example component bus assignments or connection routing data as well as EMS receivers, programmable blanker channel numbers and EMS transmitters. However, alternative embodiments could permit manual inputs using these menus which store the manually input data into data structures (e.g., FIG. 6) stored in Memory Unit 23 as well. An embodiment can include a system which merely displays pre-input choices as well.

FIGS. 2 and 3 shows other touch screen icon menu display/selects including adjustment of delay data values touch select icon 85 (e.g., 16.9 micro seconds) and adjustment to blanking pulse signal width data values touch select icon 87 (e.g., 8.1 micro seconds). Other touch screen icon controls are also included such as Store 84 and Auto Align 86. Other touch screen information displays are shown such as MCO 20 settings such as channel 1, 2 and 3 voltage scale (e.g., "CH1 5 V/DIV") and time scale (e.g., "Time 10 μs/DIV"). An example data structure is also shown in both FIGS. 2 and 3 which show the relationship between values displayed in the Touch Screen Display 25 and how those values are stored in the exemplary data structure which is shown in FIG. 6.

With regard to displayed signal traces shown in FIGS. 2 and 3, a variety of signal characteristics are shown. For example, a delay between a leading edge of a pre-trigger pulse 26 and a leading edge of a blanking pulse signal is known as a pre-trigger time delay 27. Blanking pulse signals in this embodiment have multiple signal characteristics including a pulse width 28 shown in FIG. 2 defined as a time interval between a leading edge and a trailing edge of a high, low, modulated or otherwise active blanking pulse signal (high is shown in FIG. 2 and FIG. 3). Ideally, the leading and trailing edge of a blanking pulse will be adjusted to be synchronized with a leading and trailing edge of EMI 29, 30 which is generated by an EMS Transmitter 88 (FIG. 1) which is generating interference signal reception at an EMS Receiver 90 (FIG. 1). Signal trace 30 is shown in FIG. 2 as reflections or other received EMS signals that are received after an initial transmission of an EMS signal 29.

A displayed EMI signal trace is shown in FIG. 2 which includes a received signal portion 29 from each EMS Transmitter 88 that can be described as a measured time interval and is stored in the exemplary data structures shown in FIG. 6. Delay and other blanking pulse characteristics can vary from one EMS Transmitter 88 to another EMS Transmitter 88 and with respect to where the EMS Receivers 90 are located. Immediately after receipt of an EMS Transmitter 88 pre-trigger pulse 26, Computer 19 (FIG. 1) retrieves from Memory Unit 23 (FIG. 1) stored delay and pulse width data (e.g., FIG. 6) for each EMS Receiver 90 (FIG. 1) receiving signals generated by an EMS Transmitter 88 associated with an above referenced pre-trigger signal 26. Computer 19 (FIG. 1) next uses the retrieved information in the generation of blanking pulse signals for each EMS Receiver 90 that is interfered with as further described below. Delay timing between a pre-trigger signal and the start of a blanking pulse signal is done using one or more timing circuits (not shown) within PCB 15 (e.g., two timing circuits associated with a FPGA) and is further described in greater detail below.

Stated another way, upon receipt of a pre-trigger signal from an EMS Transmitter 88, Computer 19 determines which EMS Transmitter 88 sent the pre-trigger signal based upon a detection of a pre-trigger signal 26 on a particular CTU 11 connector. Using the connector identification, Computer 19 identifies one or more data structures (e.g., FIG. 6) found in Memory Unit 23 associated with a particular EMS Transmitter 88 that sent the pre-trigger signal 26 and uses the association of data, transmitter and receiver to identify one or more EMS Receivers 90 requiring application of one or more blanking pulse signals 28. Computer 19 starts one of multiple timing circuits (not shown—included in PCB 15) for each EMS Receiver 90 requiring a blanking pulse 28 using retrieved delays stored in the above referenced data structure. Computer 19 also applies a signal to a first input of each FPGA gate in PCB 15 assigned to the specific EMS Transmitter 88 in order to set a first input high. At the end of the retrieved delay, as determined by a count in an associated timing circuit (not shown), Computer 19 sends a signal to a second input of each FPGA gate assigned to the specific EMS Transmitter 88 to set a second input high. The moment both inputs are high the output of the same FPGA gate is high. This is an example of commencement of generation of a blanking pulse signal. This operation is further described with reference to FIGS. 4 and 5.

With regard to one example of blanking pulse signal tuning and referring to FIGS. 1 and 3, Computer 19 uses pulse width information retrieved from the data structures 60 (FIG. 6) for each affected EMS Receiver 90, to control pulse widths of a blanking pulse signal 28 using one or more timing circuits in PCB 15 to determine when to terminate a blanking pulses for the affected EMS Receivers 90. A comparison of blanking pulses generated by an assigned programmable blanking channel and EMI signal characteristics from an associated EMS Receiver 90 is accomplished by one or more programmable blanker channel, including these timing circuits is accomplished. In this example, a count down is based on stored data associated with an EMS transmitter and receiver combination is started. When time zero is reached in these countdowns, Computer 19 generates another control signal that is sent to a reset input of an associated FPGA gate in a programmable blanking channel (not shown) within PCB 15 to cause the output of the gate to go low. This terminates the blanking pulse signal output from the last mentioned FPGA gate for the affected EMS Receiver 90. Two different EMS Receivers 90 may need different blanking pulses for the same EMS Transmitter 88. In that case, a pre-trigger signal from one EMS Transmitter 88 is routed by Input MM 14 to two different FPGA gates in one or more programmable blanking channel (not shown) within PCB 15. With two different programmable blanking channels in PCB 15 involved, there are two different blanking pulses 28 generated and forwarded to the two different EMS Receivers 90 by Output MM 16 based on routing control signals sent by Computer 19 based on routing assignment information stored in Memory Unit 23.

Information in an associated data structures (e.g., FIG. 6) stored in Memory Unit 23 is not required to be read out after every pre-trigger pulse after an EMS Transmitter 88 periodically transmits. The routing connections through Input MM 14, assigned ones of the FPGA gates of programmable blanking channels in PCB 15 and Output MM 16, can be left connected as long as the particular EMS Transmitter 88 is transmitting. In addition, timing circuits (not shown—e.g., in PCB 15) may continue to measure time interval or determine pre-determined time interval starting after every pre-trigger signal to the commencement of each blanking pulse and the blanking pulse widths required by the FPGA gates (FIG. 4) to generate blanking pulses.

An exemplary configuration and alignment display is shown in the upper portion of FIG. 2. With the touch screen operation of Touch Screen Display 25 a user may touch the UP and DOWN arrows in Programmable Blanking Channel Number Selection touch screen icon 80 to select one of the programmable blanking channels (e.g., port, FPGAs or gates therein) through PCB 15 to initially select a desired programmable blanking channel in PCB 15 for association with EMS Transmitter 88 and EMS Receiver 90 and other components therebetween required to establish various routing relationships including CTU 11, Input MM 14, PCB 15, Output MM 16, FSS 21 and Output Driver 17 as well as data associated with delay and pulse width associated with each EMS transmitter/receiver combination. If no EMS Transmitter 88 has been previously chosen to be associated and initially configured with a selected programmable blanking channel in PCB 15, there will be no information displayed on screen in EMS transmitter Drop Down Menu Display/Select 81, Input MM 14 connector number 82a (e.g., routing connector number "7"), Output MM 16 connector number 82b, EMS receiver Name drop down menu display/select 83, delay data value touch select icon 85 and blanking pulse width data values touch select icon 87. A user may use an unassigned programmable blanking channel to initially configure BPG 10 to operate with a new EMS Transmitter 88 and EMS Receiver 90 pair. Following programmable blanking channel selection, EMS transmitter drop down menu display/select 81 and EMS receiver drop down menu display/select 83 may be touch screen selected during configuration to access these interfaces and key in EMS receiver and/or EMS transmitter assignments or other data. A separate keyboard (not shown) could also be used to make these selections. In the example shown in FIG. 2 the identity of the EMS Transmitter 88, ATC-1, is entered via keying of EMS transmitter drop down menu display/select 81.

After initial configuration is complete, a programmable blanking channel may next be aligned in order to generate blanking pulse signals that properly blank an EMS Receiver 90 identified in EMS receiver drop down menu display/select 83. A misaligned programmable blanking channel selection "16" example is shown in FIG. 2 and an aligned programmable blanking channel selection "16" is shown in FIG. 3.

For alignment purposes a user first selects a programmable blanking channel in PCB 15 to align by keying the UP and DOWN arrows next to Programmable Blanking Channel Number Selection touch screen icon 80. In FIGS. 2 and 3 this is shown as programmable blanking channel selection "16". To select programmable blanking channel "18", a user touches the UP touch screen arrow displayed in Programmable Blanking Channel Number Selection touch screen icon 80 twice more and the number "18" will be displayed therein. After a programmable blanking channel is selected, Computer 19 retrieves information about the selected programmable blanking channel from the associated data structure stored in Memory Unit 23. For assignment of programmable blanking channel "16", select EMS transmitter Drop Down Menu Display/Select 81 in order to indicate that blanking pulse signals generated for programmable blanking channel "16" are for an EMS Transmitter 88 (shown) which is further designated as an air traffic control radar (ATC-1) at EMS receiver drop down menu display/select 83. Input MM 14 connector number 82a is data displayed indicates that the pre-trigger signals from the radar designated ATC-1 are routed to input terminal "7" of CTU 11. Output MM 16 connector number 82b indicates that blanking pulse output for programmable blanking channel "16" are connected to output terminal "4" of Output MM 16. A blanking pulse generated responsive to a pre-trigger pulse 26 from air traffic control radar (ATC-1) is sent to an EMS Receiver 90 (Rcvr-1) that is designated in EMS receiver Name drop down menu display/select 83.

When a user is finished entering data and selections, they can key the "Store" touch screen icon 84 and data and selections are stored in the data structure associated with the chosen programmable blanking channel. Alternatively a discrete, physical keyboard may be utilized.

FIG. 2 also shows exemplary waveforms displayed after initial configuration but before alignment of programmable blanking channel "16" in BPG 10. The "channel numbers" "1", "2" and "3" indicated in FIGS. 2 and 3 on the left hand side refer to three MCO 20 input channels that can be concurrently displayed using MCO 20 and not to the programmable blanking channels in PCB 15. The waveforms displayed in MCO 20 channels "1" through "3" are derived from information retrieved from a data structure associated with programmable blanking channel "16" of PCB 15 in BPG 10. Oscilloscope channel 1 shows a pre-trigger signal 26 from the EMS Transmitter 88 designated ATC 1, channel 2 shows the blanking pulse generated by the programmable blanking channel "16" circuitry in PCB 15 assigned to generate blanking pulses for the EMS Transmitter 88 designated ATC-1 and MCO 20 input channel "3" shows the signal received by the EMS Receiver 90 designated Rcvr-1 around the time that a blanking pulse is generated.

FIG. 2 shows delay and pulse width of blanking pulse 28 as misaligned when compared to interference signals 29 and 30 received by the EMS Receiver 90 designated Rcvr-1 and displayed in MCO 20 channel 3. Thus, blanking pulse 28 must be aligned so that it completely blanks interference signals 29 and 30. In this case, the interference received signal 29 is caused by EMS Transmitter 88 (ATC 1) transmitting and miscellaneous clutter 30 is caused by reflections 30 from nearby objects and in some cases from natural structures including ocean waves.

More particularly, in FIG. 2 it can be seen that blanking pulse 28 starts after the time that an EMS Receiver 90 initially receives interference signal 29 from an associated EMS Transmitter 88 and the blanking pulse 28 ends before all other interference reflection signals 30 are received by the associated EMS Receiver 90. During alignment, a starting time and pulse width of the blanking pulse 28 are adjusted by a user and are stored in the associated data structure 60 for subsequent use in generating proper blanking pulse signals 28. Exemplary data structures 60 are shown in and described with reference to FIG. 6.

As shown in FIG. 3, during alignment of programmable blanking channel "16" in PCB 15 the front edge of the blanking pulse 28 is set to match the front edge of interference signal 29 received directly from EMS Transmitter 88. A back edge of blanking pulse 28 is set to match an end of all interference signal reflections 30.

Pre-trigger delay 27 and blanking pulse 28 width settings are determined based on several variables including: 1. cable length from each EMS Transmitter 88 to CTU 11; 2. path length from CTU 11 and through Input MM 14 to a logic circuit, in this case a programmed FPGA in PCB 15; 3. path length from the logic circuit in PCB 15 to Output MM 16 which routes blanking pulse signals to specific EMS Receivers 90; 4. path length from Output MM 16 and through an Output Driver 17; cable length from the Output Driver 17 to a specific EMS Receiver 90; 5. distance from each EMS Transmitter 88 to its antenna 89; and 6. distance from the antenna 89 of an EMS Transmitter 88 to the antenna 91 of an EMS Receiver 90. In addition, the blanking pulses are also affected by the sensitivity of the EMS Receivers 90. Many of these factors are unique for each EMS Transmitter 88 and each EMS Receiver 90.

When EMS Transmitters 88 are ready to transmit, they send a pre-trigger signal 26 at a predetermined time prior to actual transmission of an EMS pulse 29 by the transmitter using its antenna 89. This predetermined time or delay was stored during configuration in the associated one of the data structures 60 shown FIG. 6 and is retrieved along with all other information stored in the same data structure upon receipt of a pre-trigger signal 26. The pre-trigger signal 26 is immediately sent to one input of a logic circuit in PCB 15 (FIG. 1) for the programmable blanking channel identified in the retrieved information. An exemplary logic circuit is shown in and described with reference to FIG. 4. Using timing circuits (not shown) controlled by Computer 19, the computer uses the retrieved pre-trigger delay interval 27 (FIG. 3) to time the pre-trigger delay. Computer 19 sends another signal to another input of the same logic circuit in PCB 15 at the end of the pre-trigger delay interval. Blanking pulse width information can also be stored in and retrieved from data structure 60.

Pulse width of blanking pulse 28 is included in information retrieved from data structure 60. Computer 19 enables one of timing circuits (not shown—included in PCB 15) to time the width of blanking pulse 28 using this pulse width information. Timing starts at the end of the pre-trigger delay interval 27. Computer 19 sends another signal to a reset input of the same logic circuit 33 (FIG. 4) in PCB 15 that is being used to generate the blanking pulse signal at the end of timing the width of blanking pulse 28. Responsive to the reset signal, logic circuit 33 terminates output of a blanking pulse.

Another exemplary feature of the novel BPG 10 described herein is automatic alignment of blanking pulse signals for the programmable blanking channels in PCB 15 to align the start time and pulse width of blanking pulses 28. In FIGS. 2 and 3 there is an "Auto Align" icon. An automatic alignment process controlled by Computer 19 and a program stored in Memory Unit 23 may be executed for each user selected programmable blanking channel when this icon is keyed. Optimal blanking pulse 28 "Delay" and "Pulse Width" values can be automatically determined, rather than manually. This automatic determination can be accomplished by changing the two values (delay and pulse width) and comparing a starting time and stop time of one or more blanking pulses with a signal received at an associated EMS Receiver 90. This operation can be repeated until the start of the blanking pulse 28 matches the beginning of signal 29 and the end of blanking pulse 28 matches the end of reflection signals 30. An alignment may thereafter be fine tuned manually, if necessary, as previously discussed above. Optimum alignment times so determined are stored by Computer 19 in an associated data structure 60 and thereafter retrieved and used to produce blanking pulses 28 for selected programmable blanking channels. In an alternative embodiment, once the automatic alignment process is started it will cycle through all the programmable blanking channels and repeat the above described automatic alignment for all programmable blanking channels.

Blanking pulse signals 28 generated as described above can be used in a different manner by different EMS Receivers 90. For some EMS Receivers 90, blanking pulse signals are used to blank a receiver's input; for other EMS Receivers 90, blanking pulse signals are used to disable a receiver's input; for other EMS Receivers 90, blanking pulse signals are used to momentarily disconnect Antenna 91 from an EMS Receiver 90.

Figure 4:
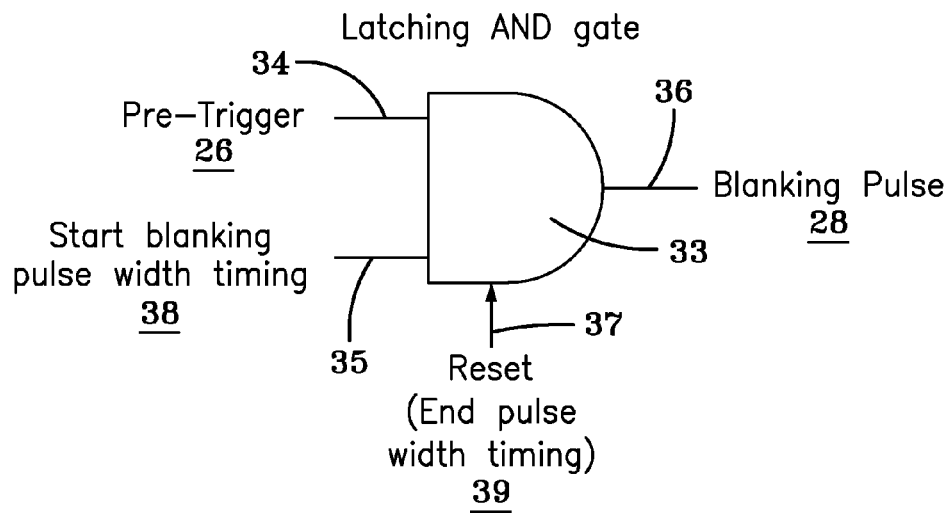
FIG. 4 shows an exemplary latching AND gate in a programmable blanking channel used to generate blanking pulses which is contained within an exemplary Programmable Channel Blanker (PCB) shown in FIG. 1.
Figure 5:
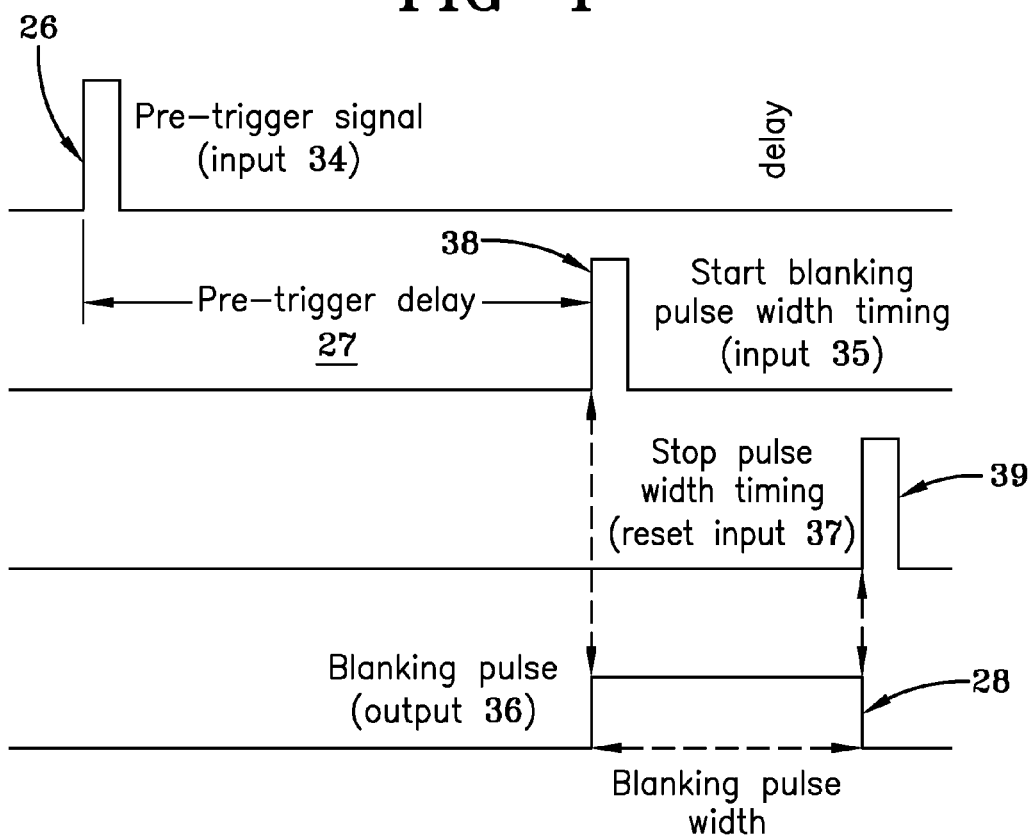
FIG. 5 shows an exemplary timing chart showing how one embodiment of latching AND gates respond to signals, starting with pre-trigger signals to generate blanking pulses.

In FIG. 4 is shown an exemplary latching AND gate 33 created using FPGAs for each of the plurality of programmable blanking channels in PCB 15 and used to generate blanking pulses 28. Operation of latching AND gate 33 is described in conjunction with the description of the timing diagram in FIG. 5. There are as many latching AND gates 33 as there are programmable blanking channels through PCB 15. FIG. 4 shows a pre-trigger signal 26 (top row of FIG. 5) is applied to input 34 of latching AND gate 33 as soon as it is received from an EMS Transmitter 88. This sets input 34 high where it remains until AND gate 33 is reset at the end of generating a blanking pulse 28 at its output 36. Gate 33 may be operated in different ways to achieve the same end result or, alternatively, other logic circuit arrangements maybe utilized to achieve the same end result.

As previously described, a blanking pulse is started at the end of timing the pre-trigger delay and timing for a blanking pulse width is accomplished using timing circuits (not shown—e.g., in PCB 15). Computer 19 causes second input 35 of latching AND gate 33 to be set high at the start of timing the width of a blanking pulse where it remains until AND gate 33 is reset at the end of generating a blanking pulse 28 at its output 36. Output 36 of Gate 33 is set high with both inputs 34 and 35 set high thus starting generation of a blanking pulse 28. As seen in the second row of FIG. 5, at the end of pre-determined pre-trigger delay 27 time period defines a starting point for blanking pulse width pulse 38 which is generated by Computer 19. The blanking pulse width pulse 38 is applied to input 35 of AND gate to cause the start of this blanking pulse 28.

More particularly, Computer 19 determines which EMS Transmitter 88 a pre-trigger signal 26 originates from upon detection of a pre-trigger signal 26 based upon detection at an input terminal number of the pre-trigger signal 26. Computer 19 searches the data structures using the input terminal number to find a match in a particular data structure 60 associated with the EMS Transmitter 88 that sent the pre-trigger signal and retrieves the matched/associated pre-trigger delay interval data 27 and other information from the selected data structure 60. Computer 19 initiates signal timing using the retrieved pre-trigger delay interval and at the end of the pre-trigger delay interval it outputs start pulse width signal 38. Signal 38 is applied to second input 35 of AND gate 33 which sets this input of the associated latching AND gate 33 to its high state. At this moment both inputs 34 and 35 of AND gate 33 are high and output 36 of latching AND gate 33 goes high as seen in the bottom row of FIG. 5. This is the start of blanking pulse 28. The blanking pulse 28 is forwarded to an EMS Receiver 90 as indicated by the output terminal number stored in an associated data structure.

Also included in information retrieved from associated data structure 60 is a pulse width of blanking pulse 28 that is generated at output 36 of gate 33. Computer 19 continues timing the width of a blanking pulse 28 using timing circuits (not shown—e.g., in PCB 15) after a pre-trigger delay 27 has been timed and a pulse 38 generated. Computer 19 generates a stop pulse 39 which is applied to reset input 37 of latching AND gate 33 of the associated programmable blanking channel at the end of timing the width of a blanking pulse 28. Pulse 39 causes a reset of both inputs 34 and 35 to their low state and the blanking pulse returns to its zero state as seen in the bottom row of FIG. 5. AND gate 33 and Computer 19 now await receipt of a subsequent pre-trigger signal 26 and the cycle described above is repeated to generate further blanking pulses.

FIG. 6 shows data structures 60a-60n having stored information about and concerning each EMS Transmitter 88 connected to or receiving signals from BPG 10. Data structure organization in this embodiment is the same and only one of them is described herein. Blanking Channel number, e.g., "1" is an identifier for a specific programmable blanking channel circuit within PCB 15. Blanking Channel number is also used as a port ID for output of Input MM 14 and input to Output MM 16. Input Number represents inputs and outputs for CTU 11 and inputs to Input MM 14. Input Name is the name or identifier of an EMS Transmitter 88 type or specific instance of an EMS Transmitter 88 type. Output Number represents an assigned output port for Output MM 16 and input & output ports for Output Driver 17. Output Name represents a name or identifier of an EMS Receiver 90 or specific instance of an EMS receiver type. Alignment Signal Instance represents an assigned port in the FSS 21 coupled to one or more signals within, from or associated with EMS Receiver 90 that is associated with the previously associated Output Name Receiver e.g., "FSS port 1". It should be noted that the Alignment Signal Instance can have multiple instances or in other words can be an array within an array for each EMS receiver associated with an EMS Transmitter 88 stored in above Input Name data field. Multiple instances of alignment signal instance is required due to receiver characteristics having multiple signals required for aligning blanking pulse e.g., circuit pathways from various components in EMS Receiver 90 to the BPG 10. Delay is a delay value associated with above referenced transmitter/receiver pair. Pulse width is a pulse width value associated with above referenced transmitter/receiver pair.

Figure 7:
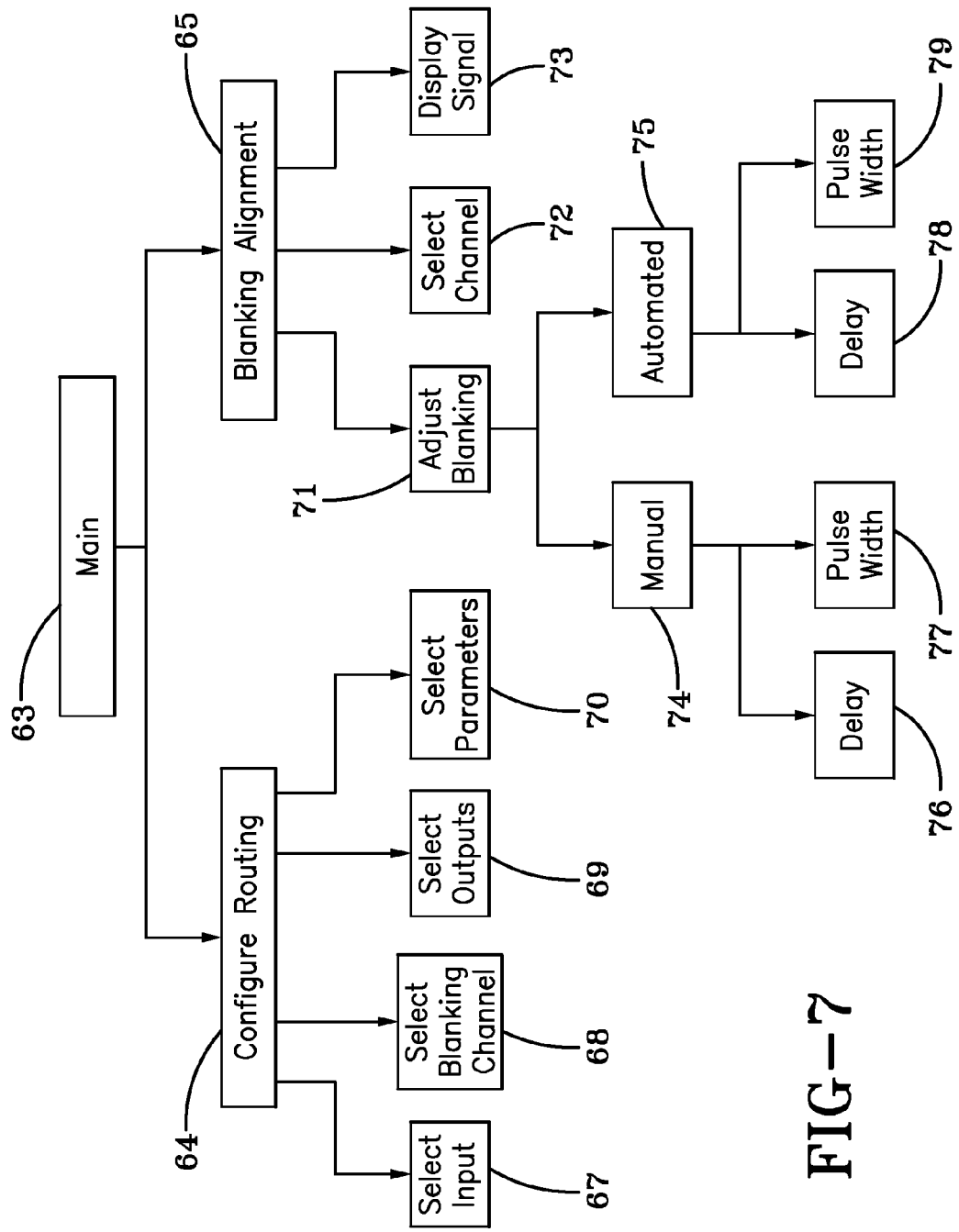
FIG. 7 shows an exemplary processing sequence diagram generally showing configuration and alignment steps for an EMI control or blanking circuit.

FIG. 7 shows an exemplary processing sequence diagram associated with configuration and alignment steps for BPG 10. This description of the steps performed is somewhat abbreviated since they have previously been described in detail with reference to FIGS. 1-6. Starting at main processing sequence 63, a stored program first determines whether the system is in initial configuration or alignment mode. The processing sequence 63 determination is based on a selection made by a user on Touch Screen Display 25 after enabling the display as previously described. With reference to FIG. 2, if a user touches ones of icons 81, 82 and/or 83, possibly after touching icon 80 to select a programmable blanking channel number, Computer 19 executes the initial configuration mode. In initial configuration mode, a programmable blanking channel is selected and other information such as input and output terminal numbers as well as EMS Transmitter 88 and EMS Receiver 90 names are entered by the user. Alternatively, with reference to FIG. 2, Computer 19 enters into alignment mode when the user selects touch screen icons 85 and 87, possibly after keying touch icon 80 to select a programmable blanking channel number.

Operations branch to processing sequence 64 "Configure Routing" when Computer 19 determines that the system is in initial configuration mode. Computer 19 next determines which of the initial configuration functions are being performed. Typically, a user first selects an idle programmable blanking channel in PCB 15 when setting up BPG 10 to operate with a new EMS Transmitter 88. This is done at processing sequence 68 "Select [Programmable] Blanking Channel". Channel selection is done by touching the up and down arrows in Channel Number processing sequence 80 shown in FIGS. 2 and 3 to change the selected programmable blanking channel number. When an unassigned programmable blanking channel number is selected there will be no information displayed in processing sequences 81, 82 and 83 in FIG. 2.

Processing progresses to processing sequence 67 "Select Input" when Computer 19 receives input that user has keyed a left side of BPG processing sequence 82 (input terminal) (FIG. 2) on Touch Screen Display 25 (FIG. 1). Computer 19 displays an touch screen keyboard (not shown in the figures) on Touch Screen Display 25 which permits a user to select an idle input terminal on CTU 11 associated with a cable from an EMS Transmitter 88.

Similarly, processing progresses to processing sequence 69 "Select Outputs" when Computer 19 detects that a user has keyed a right side of processing sequence 82 (output terminal) (FIG. 2). Computer 19 again displays an touch screen keyboard on Touch Screen Display 25 (not shown in any of the figures) to enable a user to select an idle output terminal from BPG 10 to which a cable can be connected to carry blanking pulse signals to a specific EMS Receiver 90. Processing sequence of steps described in processing sequences 67, 69 and 70 may be varied. One possible order is described below.

Next, at processing sequence 70 "Select Parameters", a user inputs initial delay and pulse width information by selecting touch user interface UP and DOWN arrow screen portions in processing sequences 85 and 87 in FIG. 2. During subsequent system alignment the initial delay and pulse width information is modified as previously described with reference to FIG. 3.

Processing branches to processing sequence 65 "Blanking Alignment" when Computer 19 determines that the system is in blanking alignment mode. Blanking alignment mode is determined by Computer 19 by analyzing which touch screen icons are keyed by a user. Typically, a user initially selects a programmable blanking channel to be aligned at processing sequence 72 "Select Channel". At processing sequence 73 "Display Signal", Computer 19 then retrieves all information from a data structure 60 associated with the selected programmable blanking channel and stored information is displayed as shown in FIGS. 2 and 3.

Next, processing continues at processing sequence 71, "Adjust Blanking", after programmable blanking channel selection and information display. Computer 19 next determines if system alignment is to be accomplished manually or automatically. Computer 19 determines automated alignment is to be utilized when Computer 19 detects user selection of touch screen icon 86 ("Auto Align"). Processing next continues to processing sequence 75 "Automated".

Automated alignment operations commence when Computer 19 retrieves a delay 27 and a pulse width data used to generate a blanking pulse 28 from one of a plurality of data structures 60a-60n associated with a chosen programmable blanking channel. Automated alignment operations executed by Computer 19 are controlled based on a program stored in Memory Unit 23. Computer 19 then compares a generated blanking pulse 28 having a determined width and delay against interference reflection or EMI signals 29 and 30 received by an associated EMS Receiver 90. Under control of the stored program Computer 19 adjusts delay and pulse width values associated with each generated blanking pulse 28 until Computer 19 no longer detects interference signals 29 and 30 reception by an EMS Receiver 90 associated with a predetermined/associated EMS Transmitter 88. Adjusted delay and blanking pulse width values are then stored in a data structures 60a-60n which contains data for the particular EMS Receiver 90 and predetermined/associated EMS Transmitter 88 and are used thereafter for generating blanking pulses 28 after each pre-trigger signal is received for a particular EMS transmitter/EMS receiver combination.

Alternatively, processing continues from processing sequence 71 to manual processing when Computer 19 determines manual alignment has been selected when Computer 19 detects user keying of touch screen icon Delay 85, possibly preceded by keying touch screen icon Blanking Channel Number 80 to select a programmable blanking channel. At processing sequence 74, Computer 19 executes a stored program and retrieves Delay 27 and Pulse Width values associated with generating a blanking pulse 28 and other required information that is associated with a user selected programmable blanking channel connected to an EMS transmitter from data structures 60a-60n. Computer 19 cooperating with MCO 20 and Touch Screen Display 25 displays a graphical user interface e.g., FIGS. 2 and 3. A user visually compares a delay and pulse width value(s) of a blanking pulse 28 against interference signals 29 and 30 in manual alignment mode. The user then manually adjusts the delay and pulse width values retrieved from the associated data structure 60a-60n and displayed in processing sequences 85 and 87 using touch screen UP and DOWN arrows until the interference reflection signals 29 and 30 are completely blanked, as shown in FIG. 3. A user selects touch screen Store icon 84 to complete manual adjustment and store adjusted delay and pulse width values. Stored adjusted values can be used in subsequent generation of blanking pulses 28 for an associated EMS Receiver 90 responsive to an EMS Transmitter's 88 pre-trigger signal(s).

Figure 8B:
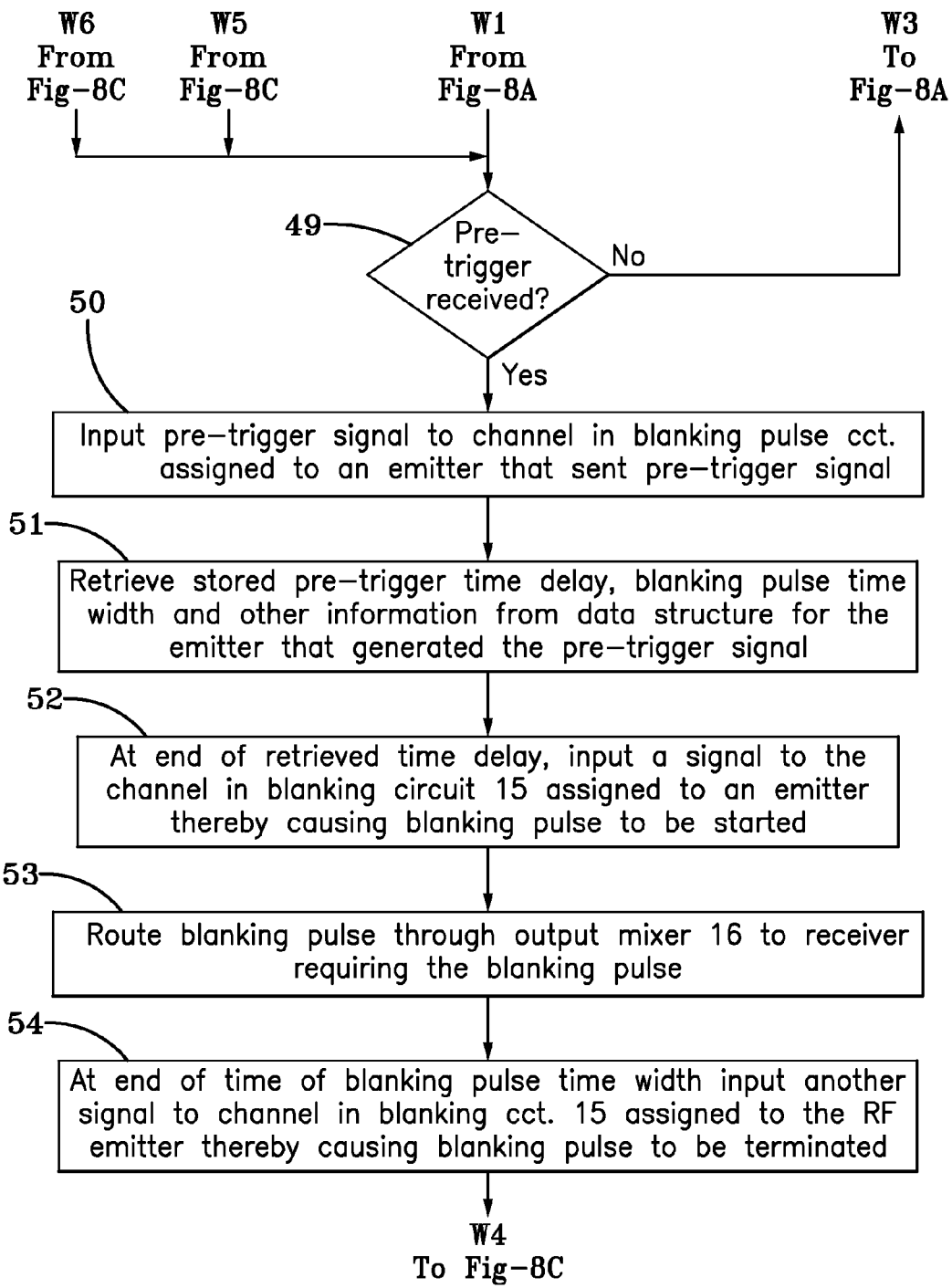
Figure 8C:
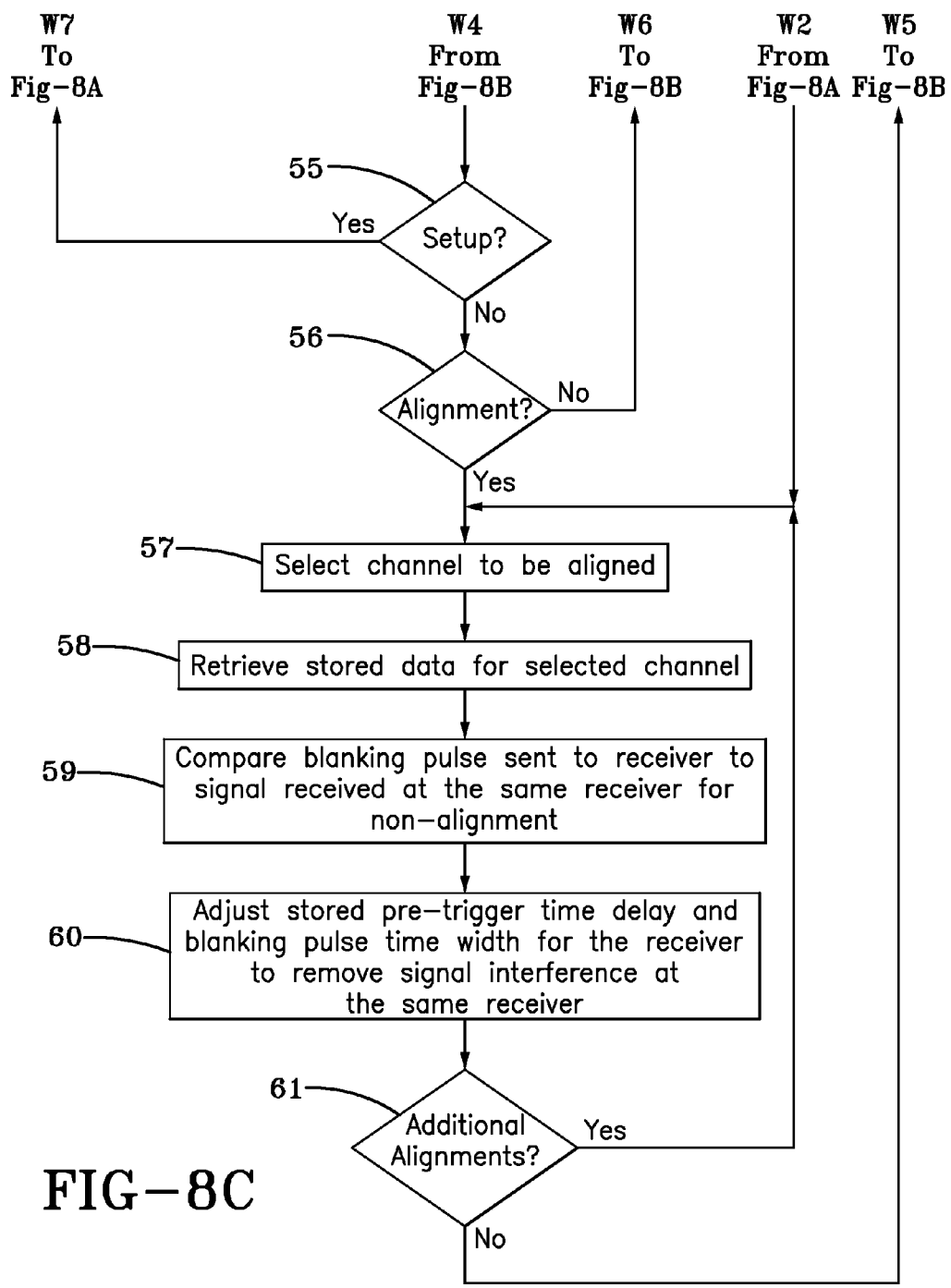

FIGS. 8A-8C shows a processing flow chart associated with an exemplary improved BPG 10 including configuration and alignment processing. FIG. 8A shows an exemplary process for initial configuration of BPG 10 to function with an EMS Transmitter 88. FIG. 8B shows steps involved in generating blanking pulses responsive to received pre-trigger signals. FIG. 8C shows the steps involved in aligning generated blanking pulses to properly cancel interference reflected signals received by an EMS receiver. FIGS. 8A, 8B and 8C represent processing associated with major program modules such as, for example, those depicted in FIG. 7.

Referring to FIG. 8A, an exemplary program commences processing at "Start" processing sequence 40. Processing sequence 40 is a decision processing sequence where it is determined if a user wishes to initially configure an unassigned programmable blanking channel. Initial configuration is done in order to associate the unassigned programmable blanking channel with a particular EMS transmitter connected to BPG 10 and thereby associate the EMS transmitter with one or more EMS receiver(s) which receive EMI from said EMS transmitter. Initial configuration is done by Computer 19 detecting if the user has keyed ones of touch screen icons 81, 82 and 83, possibly preceded by touching touch screen icon 80 to select an unassigned programmable blanking channel. If none of touch screen icons 81, 82 and 83 are keyed the program exits processing sequence 40 at No and progresses to the input of "Alignment?" decision processing sequence 48 to determine if the user wishes to align a selected programmable blanking channel. Conversely, if it is determined at processing sequence 40 that programmable blanking channel configuration is to be performed the program exits processing sequence 40 at Yes and progresses to processing sequence 41 wherein an EMS Transmitter 88 is assigned to an unassigned programmable blanking channel in PCB 15 and the assigned programmable blanking channel is stored in the associated data structure shown in FIG. 6. This operation has previously been described with reference to FIG. 2 and is not repeated here.

Alternatively, initial configuration can be accomplished at processing sequence 40 by selecting a touch screen icon (not shown) which initiates a configuration sequence permitting a user to associated unassigned programmable blanking channels associated with EMS transmitters and EMS receivers. A user will select a programmable blanking channel identifier (e.g., associate a number or identifier) to associate the identifier with a particular EMS transmitter and then select one or more EMS receivers which require blanking processing based on multiple stored, subsequently stored or subsequently adjusted stored signal characteristics such as delay and pulse width.

Initial configuration processing continues at processing sequence 42 where preliminary timing values for pre-trigger delay and pulse width are selected, names for the new EMS Transmitter 88 and EMS Receivers 90 are selected and input and output terminals are selected and all this is stored in an associated data structure shown in FIG. 6. Timing values are selected by the user using the UP and DOWN arrows in touch screen icons 85 and 87 (FIG. 2) as previously described and exact alignment of the blanking pulse is performed during the alignment phase described with reference to FIG. 8C. Using a touch screen display keyboard the user enters the name of the EMS Transmitter 88 in processing sequence 81, the name of the associated EMS Receiver 90 in processing sequence 83 and the input and output terminal numbers in processing sequence 82. Following the selections and entries the user touches Store icon 84 to store the new information in the associated one of the data structures 60. Moving to step 43 the program configures Input MM 14 to connect the chosen input terminal to the input of the chosen programmable blanking channel in PCB 15. Then, at step 44 the program configures Output MM 16 to connect the output of the chosen programmable blanking channel in PCB 15 to the appropriate output terminal of BPG 10 to forward blanking pulse signals to the appropriate EMS Receiver 90.

The above completes configuration of one programmable blanking channel in PCB 15. The stored program running on Computer 19 progresses to decision processing sequence 45 to determine if there are any additional EMS Transmitters 88 to be assigned to and initially configured with unassigned programmable blanking channels in PCB 15. If it is determined that there are additional EMS Transmitters 88 to be initially configured, the program exits decision processing sequence 45 at Yes and cycles back via path 46 to the input of processing sequence 41 to repeat the steps in processing sequences 41, 42, 43 and 44 for the additional EMS Transmitter 88.

If it is determined at processing sequence 45 that there are no additional EMS Transmitters 88 to be initially configured, the program exits decision processing sequence 45 at "No" and the program progresses to decision processing sequence 48 where the program determines if the user is requesting to align the delay and pulse width for any programmable blanking channels within PCB 15. The processing sequence 48 determination is made by monitoring which touch screen icons a user keys as previously described. If the decision at processing sequence 45 is negative the program exits processing sequence 45 at "No" and progresses via path W1 to decision processing sequence 49 in FIG. 8B to monitor for pre-trigger signals. If the decision at processing sequence 45 is in the affirmative, as determined by touch screen icons keyed by the user, the program exits processing sequence 45 at Yes and progresses via path W2 to processing sequence 57 in FIG. 8C. Processing sequence 57 in FIG. 8C is the first step in aligning a blanking pulse 28 with interference signals 29 and 30 (FIGS. 2 and 3).

Upon the program proceeding to decision processing sequence 49 in FIG. 8B via path W1, the program monitors for receipt of pre-trigger signals from any of the EMS Transmitters 88 connected to CTU 11. The program continuously loops through processing sequence 49 via processing sequences 45 and 48 until a pre-trigger signal is received. More particularly, when the decision at processing sequence 49 is No the program returns via path W3 to the input of decision processing sequence 45 in FIG. 8A where the program checks to determine if a programmable blanking channel initial configuration is to be performed, followed by a check at decision processing sequence 48 to determine if a programmable blanking channel is to be aligned. The operation at processing sequences 45 and 48 is described hereinabove. When the program determines at decision processing sequence 49 that a pre-trigger signal has been received it proceeds to processing sequence 50 where Computer 19 uses the knowledge of what input terminal the pre-trigger signal is detected on to route the pre-trigger signal to the assigned programmable blanker channel in PCB 15.

The program then progresses to processing sequence 51 and Computer 19 uses the identified input terminal to locate the associated one(s) of the data structure(s) 60 and retrieves there from the pre-trigger delay, blanking pulse time width, input and output terminal identification and the stored names of the EMS Transmitter 88 and associated EMS Receiver(s) 90. This retrieved information is displayed for each programmable blanking channel as shown in FIGS. 2 and 3 and the timing figures are used in generating the blanking pulse 28 displayed in FIGS. 2 and 3. The received pre-trigger signal is routed to first input 34 of an assigned latching AND gate 33 (FIG. 4) in the assigned programmable blanking channel of PCB 15.

Using the retrieved pre-trigger delay information Computer 19 starts a timing circuit (e.g., within PCB 15) to time an identified/active pre-trigger delay and, as indicated at processing sequence 52, at the end of the delay Computer 19 sends a start pulse to the second input 35 of the latching AND gate 33 (FIG. 4) previously discussed. This causes the output 36 of the latching AND gate 33 to go high which is the beginning of a blanking pulse 28 as shown in FIGS. 2 and 3. At the same time Computer 19 starts another timing circuit (e.g., within PCB 15) to time the pulse width of a generated blanking pulse for purposes of determining a termination point for the blanking pulse.

At processing sequence 53 the program routes the blanking pulse 28 being generated through Output MM 16 and its associated Output Driver 17 to the particular output terminal of BPG 10 which is retrieved from an associated data structure. The identified EMS Receiver 90 requiring the blanking pulse is connected to this BPG 10 output terminal.

At processing sequence 54 the program determines when a timing circuit timing a pulse width of a blanking pulse has completed its timing function and Computer 19 responds thereto to send a signal to reset input 37 of the latching AND gate 33 (FIG. 4) which resets the gate and causes its output 36 to go low. This low state in output 36 results in termination of a blanking pulse generated by a programmable blanker channel within PCB 15 for a particular EMS Transmitter 88.

Processing continues via path W4 to decision processing sequence 55 in FIG. 8C after blanking pulse generation has been performed as indicated by processing sequences 50-54. The program running on Computer 19 performs the steps in decision processing sequences 55 and 56 to determine if the user has keyed any touch screen icons indicating they wish to either perform the configuration of a programmable blanking channel or to align a programmable blanking channel. If no initial configuration or alignment is to be performed the program will exit decision processing sequence 56 at No and cycle back via path W6 to the input of decision processing sequence 49 in FIG. 8B to monitor for further pre-trigger signals and generate blanking pulses responsive thereto as previously described. More particularly, at decision processing sequence 55 the program continues monitoring to determine which touch screen icons (FIG. 2) are keyed by a user, as previously described, to determine if a programmable blanking channel is to be initially configured. If the decision is in the affirmative, the program exits processing sequence 55 at Yes and continues via path W7 to the input of processing sequence 41 in FIG. 8A. Processing sequence 41 is a first step in performing a configuration of a programmable blanking channel such as previously described. If the decision at processing sequence 55 is in the negative, the program exits processing sequence 55 at No and progresses to decision processing sequence 56 to determine if a programmable blanking channel is to be aligned. Determination of whether or not programmable blanking channel alignment processing selection has been initiated can be accomplished by program monitoring which touch screen icons a user keys or another condition which is sensed such as a determination that a programmable blanking channel is out of alignment with a reference value. If the decision is in the negative, the program exits processing sequence 56 at No and goes via path W6 back to the input of decision processing sequence 49 in FIG. 8B to monitor for further pre-trigger signals and generate blanking pulses responsive thereto. If the decision at processing sequence 56 is in the affirmative, indicating that a programmable blanking channel is to be aligned, the program exits processing sequence 56 at Yes and progresses to processing sequence 57. Processing sequences 57-60 perform the program steps to align a programmable blanking channel as described hereinafter.

At processing sequence 57 the program determines which programmable blanking channel has been selected to be aligned by the user touching the UP and DOWN icons at processing sequence 80 in FIGS. 2 and 3, followed by touching ones of icons 81-84. The programmable blanking channel having been identified, the program progresses to processing sequence 58 and Computer 19 retrieves the information stored in the identified one of the data structures 60a-60n (FIG. 6) for the chosen programmable blanking channel. The information is displayed in touch screen processing sequences 80-87 of Touch Screen Display 25 as shown in FIGS. 2 and 3 and the displayed information is used during the alignment process.

The program then progresses to processing sequence 59 where the blanking pulses generated using the delay and pulse width information retrieved from the associated data structure 60 are visually or automatically compared to the signals received by the EMS Receiver 90 for which the blanking pulses is generated by the associated EMS Transmitter 88. There may be other EMS Receivers 90 that are being interfered with by the last mentioned EMS Transmitter 88 that will also require blanking pulses to be generated using other programmable blanking channels in PCB 15. Progressing to processing sequence 60 the alignment is performed either manually or automatically as generally described with reference to FIG. 7. When performed manually a user can visually compare a generated blanking pulse 28 and interference signals 29 and 30 received by EMS Receiver 90 and displayed on Touch Screen Display 25 via MCO 20 under control of Computer 19 as shown in FIG. 2. As shown in FIG. 2 and as previously described in detail, when comparing oscilloscope channels 2 and 3, alignment of the blanking pulse 28 is required. For manual alignment a user keys the UP and DOWN arrows in on screen icons/processing sequences 85 in 87 to select/change delay and the pulse width settings for generated blanking pulse 28 until a generated/sampled blanking pulse are synchronized with and properly blank interference signals 29 and 30 as shown FIG. 3.

When the user has completed the alignment of the chosen programmable blanking channel they can touch select a Store icon 84 to store a final delay and pulse width information. As described in greater detail with reference to FIG. 6, at times more than one EMS Receiver 90 may receive interference signals 29 and 30 caused by the transmissions of a single EMS Transmitter 88. A different programmable blanking channel in PCB 15 is utilized for each EMS Receiver 90 needing a blanking pulse responsive to a pre-trigger pulse from the EMS Transmitter 88.

When an alignment of a selected programmable blanking channel is completed, the program progresses to decision processing sequence 61. At processing sequence 61, the program determines if the touch screen icons keyed by a user indicate that another programmable blanking channel is to be aligned. If the answer is in the affirmative, the program exits processing sequence 61 at Yes and cycles back to the input of processing sequence 57 to re-perform the alignment steps in processing sequences 57-61 to align the another programmable blanking channel.

If, at decision processing sequence 61, the decision is negative, the program exits processing sequence 61 at No and cycles via path W5 back to the input of decision processing sequence 49 in FIG. 8B to monitor for further pre-trigger signals. The operation of monitoring for pre-trigger signals and generating blanking pulses has been described hereinabove.

It should be understood that FIG. 7 has been described in the context of processing sequences and actions associated with each sequence. However, the embodiment described in FIG. 7 also represents one example of software or a control program which is used to perform the tasks described herein. Data structures described in exemplary FIG. 6 are used to store data which is used by the example program described above and represented by functional code blocks shown in FIG. 7. FIGS. 8A, 8B and 8C discuss processing which is accomplished by the exemplary program structure described in FIG. 7.

While what has been described herein is a preferred embodiment of the invention it will be understood that many additional changes in the details, materials, steps and arrangement of parts, which have been described and illustrated herein order to explain the nature of the invention, may be made by those skilled in the art within the principles and scope of the invention as expressed in the appended claims. For example, the blanking pulses may be generated in ways other than using the FPGA in a programmable blanking channel within PCB 15.

The invention claimed is:

1. A signal processing system comprising:
   a signal processor having a plurality of circuits, each circuit being adapted to generate a blanking pulse signal having a given duration a predetermined amount of time after receiving a pre-trigger signal at a first input of the last mentioned circuit from one of a plurality of EMS transmitters and each of said plurality of EMS transmitters transmits an EMS signal at the end of its predetermined amount of time;
   a first signal router adapted to route pre-trigger signals from an EMS transmitter to at least one of said signal processor circuits;
   a second signal router adapted to route blanking pulse signals generated by and at the output of ones of said signal processor circuits to selected ones of a plurality of EMS receivers to protect them from signal interference caused by interference reflections of said EMS signals that are received at said receivers by either rendering said EMS receivers incapable of receiving any EMS signals during the duration of each blanking pulse signal or by rendering said EMS receivers incapable of displaying any EMS signals during the duration of each blanking pulse signal; and
   memory storing both the predetermined amount of time following a pre-trigger signal associated with each EMS transmitter and the duration of a blanking pulse signal to be routed to each EMS receiver, each predetermined amount of time and duration of a blanking pulse signal being retrieved from said memory following receipt of a pre-trigger signal and used to generate a blanking pulse signal.

2. The signal processing system in accordance with claim 1 wherein each of said plurality of signal processor circuits comprises a latching AND gate having two inputs, a reset input and an output, said two inputs, said reset input and said output are in a first state when said AND gate is not in use and are in a second state at different times when said gate is in use generating a blanking pulse signal.

3. The signal processing system in accordance with claim 2 wherein each pre-trigger signal from an EMS transmitter is input to a first of said two inputs of a latching AND gate and causes said first input to change from its first state to its second state, wherein after said predetermined amount of time after receipt of a pre-trigger signal said second of said two inputs is caused to change from its first state to its second state and when said two inputs are in their second state the output of said last mentioned AND gate changes from its first state to its second state and thereby commences said blanking pulse signal at said output and after a time equal to said given blanking pulse signal width said reset input changes from its first state to its second state which results in said two inputs being reset to their first state and the output is thereby caused to return to its first state and thereby end said blanking pulse signal.

4. The signal processing system in accordance with claim 3 further comprising:
   first timing means timing said predetermined amount of time after receipt of said pre-trigger signal and then generating a first pulse that is applied to said second input to change it from its first state to its second state and
   second timing means started after said first timing means has timed said predetermined amount of time for timing said blanking pulse signal width and then generating a second pulse that is applied to said reset input to change it from its second state to its first state to end said blanking pulse signal.

5. The signal processing system in accordance with claim 1 of further comprising:
   first timing means timing said predetermined amount of time after receipt of said pre-trigger signal and then generating a first pulse that is applied to said second input to change it from its first state to its second state and
   second timing means started after said first timing means has timed said predetermined amount of time for timing said blanking pulse signal width and then generating a second pulse that is applied to said reset input to change it from its second state to its first state to end said blanking pulse signal.

6. The signal processing system in accordance with claim 5 wherein said EMS transmitters comprise a radar transmitter, a navigation transmitter or a communication transmitter.

7. The signal processing system in accordance with claim 6 further comprising a control processor adapted to controlling the first signal router, signal processor circuits, second signal router, first timing means and second timing means.

8. The signal processing system in accordance with claim 1 further comprising a control processor adapted to controlling the first signal router, signal processor circuits and second signal router.

9. A method for processing signals comprising the steps of:
   (a) receiving a pre-trigger signal from ones of a plurality of EMS transmitters a predetermined amount of time before they transmit;

(b) timing a first interval equal to said predetermined amount of time responsive to each said pre-trigger signal;

(c) commencing the generation of a blanking pulse signal at the end of timing each said first intervals in step (b);

(d) timing a second interval immediately after timing each said first intervals in step (b), said second time interval indicating the width of a blanking pulse signal; and (e) terminating the generation of said blanking pulse signal commenced in step (c) at the end of timing a corresponding second interval in step (d);

wherein generated blanking pulse signals are sent to ones of said plurality of EMS receivers to protect them from signal interference caused by interference reflections of EMS signals that are transmitted by said one of said EMS transmitters and received at said EMS receivers by either rendering said EMS receivers incapable of receiving any EMS signals during the duration of each blanking pulse signal or by rendering said EMS receivers incapable of displaying any EMS signals during the duration of each blanking pulse signal.

10. The method for processing signals in accordance with claim 9 further comprising the steps of:

(f) routing the pre-trigger signal received in step (a) to at least one of a plurality of logic circuits which are used to generate said blanking pulse signals; and (g) routing the blanking pulse signal generated in steps (c) and (e) by said at least one of a plurality of logic circuits responsive to a pre-trigger signal in step (f) to at least one of said plurality of EMS receivers to thereby protect said EMS receiver from said signal interference caused by said interference signal reflections.

11. The method for processing signals in accordance with claim 10 further comprising the steps of:

(h) storing said first interval timed in step (b) for each of said plurality of EMS transmitters;

(i) storing said second interval timed in step (d) for each of said plurality of EMS receivers;

(j) retrieving said first interval stored in step (h) associated with an EMS transmitter whose pre-trigger signal is received in step (a); and (k) retrieving said second interval stored in step (i) associated with each EMS receiver to receive a blanking pulse signal generated in steps (c) through (e);

wherein each retrieved first interval and second interval are used by one of said logic circuits to generate a blanking pulse signal, said logic circuits each having two inputs, a reset input and an output.

12. The method for processing signals in accordance with claim 11 further comprising the steps of:

(l) timing said first interval of time using the first time retrieved in step (j) and (m) timing said second interval of time using the second time retrieved in step (k).

13. The method for processing signals in accordance with claim 9 further comprising the steps of:

(f) storing the time of said first interval timed in step (b) for each of said plurality of EMS transmitters;

(g) storing the time of said second interval timed in step (d) for each of said plurality of EMS receivers;

(h) retrieving the time of said first interval stored in step (f) associated with an EMS transmitter whose pre-trigger signal is received in step (a); and (i) retrieving the time of said second interval stored in step (g) associated with each EMS receiver to receive a blanking pulse signal;

wherein said retrieved first intervals and second intervals are used in conjunction with ones of a plurality of logic circuits to generate said blanking pulse signals.

14. The method for processing signals in accordance with claim 13 further comprising the steps of:

(j) timing said first interval of time using the time interval retrieved in step (h) and (k) timing said second interval of time using the time interval retrieved in step (i).

15. The method for processing signals in accordance with claim 14 further comprising the steps of:

(l) setting a first of said two inputs of one of said logic circuits responsive to receipt of a pre-trigger signal from ones of said plurality of EMS transmitters;

(m) setting a second of said two inputs of said one of said logic circuits at the end of timing said first period in step (j);

(n) setting said output of said one of said logic circuits upon setting both its said first input and said second input in steps (l) and (m), said output of said logic circuit being set providing said blanking pulse signal; and (o) resetting said output of said one of said logic circuits at the end of timing the second period timed in step (k) to terminate said blanking pulse signal.

16. The method for processing signals in accordance with claim 9 further comprising the steps of:

(f) setting a first of said two inputs of one of said logic circuits responsive to receipt of a pre-trigger signal from ones of said plurality of EMS transmitters;

(g) setting a second of said two inputs of said one of said logic circuits at the end of timing said first interval in step (j);

(h) setting said output of said one of said logic circuits upon setting both its said first input and said second input in steps (l) and (m), said output of said logic circuit being set providing said blanking pulse signal; and (i) resetting said output of said one of said logic circuits at the end of timing the second interval timed in step (k) to terminate said blanking pulse signal.

17. Apparatus for aligning a signal processing system comprising:

memory storing first values indicating a predetermined amount of time following each pre-trigger signal received from each of a plurality of EMS transmitters after which predetermined amount of time said EMS transmitters transmits an EMS signal and storing second values indicating the duration of blanking pulse signals to be generated at the end of each said predetermined amount of time, said blanking pulse signals being routed to ones of a plurality of EMS receivers to protect them from signal interference caused by interference reflections of EMS signals transmitted by said EMS transmitters and received at said EMS receivers;

a comparator comparing said blanking pulse signals routed to said EMS receivers with said EMS signals received by said EMS receivers to detect misalignment between said blanking pulse signals and said received EMS signals that result in the EMS receivers not being protected from said signal interference; and a calibrator adapted to change said first values and said second values stored in said memory for each EMS transmitter in order to align said blanking pulse signals generated using said stored first and second values with the EMS signals received by corresponding ones of said EMS receivers to remove said signal interference at said EMS receivers by either rendering said EMS receivers incapable of receiving any EMS signals during the duration of each blanking pulse signal or by rendering said EMS receivers incapable of displaying any EMS signals during the duration of each blanking pulse signal.

18. The apparatus for aligning a signal processing system of claim 17 further comprising:

first input apparatus adapted to provide a first correction signal indicating to increase or decrease said first value stored in said memory for each EMS transmitter to align the start of each blanking pulse signal with the start of each transmitted EMS signal as received at a corresponding EMS receiver and second input apparatus adapted to provide a second correction signal indicating to increase or decrease said second value stored in said memory for each EMS transmitter to align the width of each blanking pulse signal with the width of each transmitted EMS signal as received at the last mentioned EMS receiver.

19. The apparatus for aligning a signal processing system of claim 18 further comprising:

memory writing means responsive to both said first and said second input apparatus for changing both said first value stored in said memory per said first correction signal and for changing said second value stored in said memory per said second correction signal;

wherein when said first value and/or when said second value stored in said memory for an EMS transmitter are changed it causes subsequently generated blanking pulse signals using both said values to remove said signal interference caused by said transmitted EMS signals at the one of said EMS receivers receiving the last mentioned blanking pulse signals.

20. The apparatus for aligning a signal processing system of claim 19 wherein said comparator comprises a video display displaying said blanking pulse signals generated using said first and said second values stored in said memory for a particular EMS transmitter and displaying the transmitted EMS signals from said last mentioned EMS transmitter as received at the one of said EMS receivers receiving the last mentioned blanking pulse signals and any non-alignment between the two signals is visibly seen.

21. The apparatus for aligning a signal processing system of claim 20 wherein said calibrator adapted to changing said stored first values and said stored second values comprises icons indicating to increase or decrease said stored first value and said stored second value for any chosen EMS transmitter and a user touches these icons after viewing a blanking pulse signal and a received EMS signal at an EMS receiver on said video display in order to align said blanking pulse signal with the received EMS signal and thereby remove said signal interference.

22. The apparatus for aligning a signal processing system of claim 17 wherein said comparator comprises a video display displaying said blanking pulse signal generated using said first and said second values stored in said memory for a particular EMS transmitter and displaying the transmitted EMS signal from said last mentioned EMS transmitter as received at the ones of said EMS receivers receiving the last mentioned blanking pulse signals and any non-alignment between the two signals is visibly seen.

23. The apparatus for aligning a signal processing system of claim 22 wherein said calibrator adapted to changing said stored first values and said stored second values comprises icons indicating to increase or decrease said stored first value and said stored second value for any chosen EMS transmitter and a user touches these icons after viewing a blanking pulse signal and a received EMS signal at an EMS receiver on said video display in order to align said blanking pulse signal with the received EMS signal and thereby remove said signal interference.

24. The apparatus for aligning a signal processing system of claim 22 wherein said video display is a Touch Screen Display and said icons are displayed on said Touch Screen Display and used by a user to configuration and align said EMS transmitters to work with said apparatus for aligning a signal processing system, one of said icons is used to select any particular EMS transmitter the pre-trigger signals for which are sent to said apparatus for aligning a signal processing system and once an EMS transmitter is so selected a plurality of information concerning said last mentioned EMS transmitter is displayed including said first and second values stored in said memory, the receiver(s) to receive a blanking pulse signal when said last mentioned EMS transmitter transmits an EMS signal and others of said icons are used to change said first and second values for alignment of blanking pulse signals and received EMS signals at corresponding receivers.

25. The apparatus for aligning a signal processing system of claim 17 further comprising:

memory writing means adapted to changing said first value stored in said memory and for changing said second value stored in said memory;

wherein when said first value and/or said second value stored in said memory for each EMS transmitter are changed it causes subsequently generated blanking pulse signals to remove said signal interference at particular ones of said EMS receivers caused by said transmitted EMS signals from said last mentioned EMS transmitters.

26. A method for aligning a signal processing system comprising the steps of:

(a) storing a first value for each of a plurality of EMS transmitters, said first value indicating a predetermined amount of time after each said EMS transmitter generates a pre-trigger signal before they transmit an EMS signal;

(b) storing at least one second value for each of said plurality of EMS transmitters, said second value indicating the duration of a blanking pulse signal generated starting at the end of said predetermined amount of time indicated by said first value stored in step (a) and said blanking pulse signal is forwarded to and used by an EMS receiver that experiences signal interference caused by EMS signals transmitted by an EMS transmitter to remove said interference by either rendering said EMS receivers incapable of receiving any EMS signals during the duration of each blanking pulse signal or to render said EMS receivers incapable of displaying any EMS signals during the duration of each blanking pulse signal;

(c) comparing said blanking pulse signals forwarded to and used by said EMS receivers with the EMS signals transmitted by said EMS transmitters as received by said EMS receivers to detect misalignment between the two last mentioned signals that causes said signal interference; and (d) modifying said first value and said second value to change the starting time and duration of a blanking pulse signal so there is no misalignment between said blanking pulse signals and said last mentioned EMS signals.

27. The method for aligning a signal processing system of claim 26 further comprising the steps of:

(e) providing a first signal indicating to increase or decrease the first value stored in step (a) for each of said plurality of EMS transmitters indicating the predetermined amount of time; and (f) providing a second signal indicating to increase or decrease the second value stored in step (b) for each of said plurality of EMS transmitters indicating the width of the blanking pulse signal.

28. The method for aligning a signal processing system of claim 27 wherein step (d) comprises the steps of:

(g) changing the first value stored in step (a) using the first signal provided in step (e); and (h) changing the second value stored in step (b) using the second signal provided in step (f), wherein changing the first value in step (g) and changing the second value in step (h) causes the generated blanking pulse signals to remove the signal interference at the EMS receivers caused by the EMS signals transmitted by the associated EMS transmitters.

29. The method for aligning a signal processing system of claim 28 further comprising the step of:

(i) generating a first video display displaying said blanking pulse signal generated using said first and said second values stored in said memory for any particular EMS transmitter and displaying the transmitted EMS signal from said last mentioned EMS transmitter as received at a particular one of said EMS receivers and any non-alignment between the two signals is visibly seen on said first video display.

30. The method for aligning a signal processing system of claim 29 further comprising the step of:

(j) generating a second video display, along with said first video display, on a touch screen monitor, said second video display displaying icons used to increase or decrease said stored first value and said stored second value for any particular EMS transmitter and a user touches these icons after viewing said blanking pulse signal and said received EMS signal displayed in step (i) to increase or decrease said stored first and second values in order to align said blanking pulse signal with said received EMS signal and thereby remove said signal interference.

31. The method for aligning a signal processing system of claim 30 further comprising the step of:

(k) generating a third video display, along with said first and second video display, on said touch screen monitor, said third video display being a icon that is keyed to select any particular EMS transmitter the pre-trigger signals from which are sent to said signal processing system and once an EMS transmitter is so selected a plurality of information concerning said EMS transmitter is displayed on said touch screen monitor including said first and second values stored in said memory and the receiver(s) to receive a blanking pulse signal when said last mentioned EMS transmitter transmits an EMS signal.

32. The method for aligning a signal processing system of claim 26 wherein step (d) comprises the steps of:

(e) changing the first value stored in step (a) as necessary to align said blanking pulse signal with said transmitted and received EMS signal; and (f) changing the second value stored in step (b) as necessary to align said blanking pulse signal with said transmitted and received EMS signal;

wherein changing the first value in step (e) and changing the second value in step (f) causes blanking pulse signals generated using said values to remove signal interference at the EMS receivers caused by EMS signals transmitted by an associated EMS transmitter.

33. The method for aligning a signal processing system of claim 26 further comprising the step of:

(e) generating a first video display displaying said blanking pulse signal generated using said first and said second values stored in said memory for any particular EMS transmitter and displaying the transmitted EMS signal from said last mentioned EMS transmitter as received at a particular one of said EMS receivers and any non-alignment between the two signals is visibly seen on said first video display.

34. The method for aligning a signal processing system of claim 33 further comprising the steps of:

(f) generating a second video display, along with said first video display, on a touch screen monitor, said second video display displaying icons used to increase or decrease said stored first value and said stored second value for any particular EMS transmitter and a user touches these icons after viewing said blanking pulse signal and said received EMS signal displayed in step (e) to increase or decrease said stored first and second values in order to align said blanking pulse signal with said received EMS signal and thereby remove said signal interference;

(g) displaying a icon that is keyed to select any particular EMS transmitter the pre-trigger signals from which are sent to said signal processing system and once an EMS transmitter is so selected a plurality of information concerning said EMS transmitter is displayed on said touch screen monitor including said first and second values stored in said memory and the receiver(s) to receive a blanking pulse signal when said last mentioned EMS transmitter transmits an EMS signal; and (h) displaying icons used to initially configure an EMS transmitter to work with said signal processing system.

35. A signal processing system comprising:

a first section adapted to detect at least one pre-trigger signal, wherein said pre-trigger signal is a signal which is sent by one or more radio frequency transmitters prior to a radio frequency signal transmission, wherein said pre-trigger signal indicates one of a category of radio frequency transmitter and receiver combinations and is used to create a blanking pulse signal;

a second section having a plurality of first circuits, each of said first circuits being adapted to generate a blanking pulse signal having a given width at a predetermined amount of time after receiving said pre-trigger signal;

a third section adapted to store signal characteristic data associated with said one or more radio frequency transmitters and receivers, wherein said signal characteristic data is used by said second section to determine and generate said blanking pulse signals associated with said radio frequency transmitter and receiver combinations such that different blanking pulse signals are generated for different said types of radio frequency transmitter and receiver combinations;

a fourth section adapted to route one or more said pre-trigger signals to one or more said first circuits; and a fifth section adapted to route one or more of said blanking pulse signals generated by said first circuits to at least one of a plurality of radio frequency receivers based on either which input port said pre-trigger signal was received or said type of radio frequency transmitter and receiver combination which is associated with one or more said pre-trigger signals.

36. A signal processing system as in claim 35, wherein said pre-trigger signal is a leading edge of a digital signal.

37. A signal processing system as in claim 36, wherein said fourth and fifth sections comprise one or more programmable logic devices including field programmable gate arrays.

38. A signal processing system as in claim 37, wherein said second section further comprises a timing section used to generate a signal to halt each of said blanking pulse signals associated with each of said receivers, wherein said data in said third section is used to determine said signal to halt and when to halt it.

39. A signal processing system as in claim 38, wherein said blanking pulse signals are generated by said second section a predetermined amount of time after detection of a pre-trigger signal by said first section.

40. A signal processing system as in claim 39, wherein ones of said first circuits in said second section generate blanking pulse signals that causes at least one of said radio frequency receiver's inputs to be blanked.

41. A signal processing system as in claim 40, wherein ones of said first circuits in said second section generate a blanking pulse signal that causes at least one of said radio frequency receiver's inputs to be disabled.

42. A signal processing system as in claim 41, wherein ones of said first circuits in said second section generate a blanking pulse signal that causes the momentary disconnection of an antenna coupled to at least one of said radio frequency receivers.

43. A signal processing system as in claim 38, wherein said timing section comprises a first and a second timer portion, wherein said first timer portion is enabled upon receipt of at least one said pre-trigger signal and times the pre-determined amount of time to start a blanking pulse when said radio frequency transmitter that transmitted said last mentioned trigger signal starts transmitting at the end of the pre-determined amount of time; and said second timer portion is enabled at the end of said pre-determined amount of time to time an interval that defines the width of a blanking pulse signal that occurs at the same time that said radio frequency transmitter is transmitting.

44. A signal processing system comprising:
a first and second routing control system, said first routing control system is adapted to receive and route at least one of a plurality of first signals received from one or more electromagnetic spectrum transmitters, said second routing control system is adapted to selectively route one or more of a second plurality of signals to one or more of a plurality of electromagnetic receivers;
a plurality of blanking control elements selectively coupled to said first and second routing control system adapted to produce said second plurality of signals and selectively input said second plurality of signals into said second routing control system;
a data structure adapted to store a plurality of data comprising signal characteristics associated with said electromagnetic transmitters and receivers including data associated with said first plurality of signals, a plurality of first and second signal delay data, transmitter identifier data, receiver identifier data, a plurality of first and second pulse width data, blanking control element identifier and assignment data, port assignment data,
a processing system adapted to selectively couple circuits between said first and second routing control system and said plurality of blanking control elements, control said plurality of blanking control elements and control coupling of said second routing control system with said one or more plurality of electromagnetic receivers;
a third routing control system coupled to said signal analyzer adapted to selectively couple with at least one of a plurality of said electromagnetic spectrum transmitters adapted to receive at least said third plurality of signals;
a user interface adapted to permit input of data and control operations of said signal processing system; and
a signal analyzer coupled to said first routing control system and said processing system adapted to analyze said first plurality of signals, said second plurality of signals and said third plurality of signals, wherein said signal analyzer produces comparison data or signals including data or signals based on a comparison of said second and third plurality of signals;
wherein said processing system controls said first, second and third routing control system and said plurality of blanking control elements based on signals or data from said signal analyzer, said user interface, said plurality of data in said data structure, and signal comparisons produced by said signal analyzer including comparisons of said second and third plurality of signals.

45. A signal processing system as in claim 44, wherein said blanking control elements are controlled by said processing system to perform blanking pulse tuning, said tuning based on receiving inputs from said first and second routing control systems such that the blanking control elements controls, creates and tunes blanking signals based on signal characteristics associated with one or more said electromagnetic transmitter/receiver pairs where the receiver receives interference signals from said transmitter.

46. A signal processing system as in claim 44, wherein said at least one of a first plurality of signals comprises a pre-trigger signal associated with said electromagnetic transmitter.

47. A signal processing system as in claim 44, wherein said second plurality of signals is a blanking signal adapted to blank or mask a signal received by one or more said electromagnetic receivers.

48. A signal processing system as in claim 44, wherein said third plurality of signals comprise output signals from one or more said electromagnetic receivers.

49. A signal processing system as in claim 44, wherein said blanking control elements comprise field programmable gate arrays, programmable logic arrays, application specific integrated circuit or a software implemented program run on a general processing integrated circuit system.

* * * * *